US012776750B2

(12) United States Patent
Kogure et al.

(10) Patent No.: US 12,776,750 B2
(45) Date of Patent: Oct. 27, 2026

(54) TRACKER MODULE AND COMMUNICATION DEVICE

(71) Applicant: Murata Manufacturing Co., Ltd., Nagaokakyo (JP)

(72) Inventors: Takeshi Kogure, Nagaokakyo (JP); Tomohide Aramata, Nagaokakyo (JP); Toshiki Matsui, Nagaokakyo (JP); Yuuki Fukuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 380 days.

(21) Appl. No.: 18/616,760

(22) Filed: Mar. 26, 2024

(65) Prior Publication Data

US 2024/0235486 A1 Jul. 11, 2024

Related U.S. Application Data

(63) Continuation of application No. PCT/JP2022/035973, filed on Sep. 27, 2022.

(30) Foreign Application Priority Data

Sep. 29, 2021 (JP) ................................. 2021-159812

(51) Int. Cl.
*H03F 1/02* (2006.01)
*H03F 3/24* (2006.01)

(52) U.S. Cl.
CPC ........... *H03F 1/0233* (2013.01); *H03F 3/245* (2013.01); *H03F 2200/105* (2013.01); *H03F 2200/451* (2013.01)

(58) Field of Classification Search
CPC .. H03F 1/0233; H03F 3/245; H03F 2200/105; H03F 2200/451;

(Continued)

(56) References Cited

U.S. PATENT DOCUMENTS 8,824,978 B2 9/2014 Briffa et al.
9,351,404 B2 5/2016 Satake (Continued)

FOREIGN PATENT DOCUMENTS

JP S6379350 A 4/1988
JP 2015-533066 A 11/2015

(Continued)

OTHER PUBLICATIONS

International Search Report received for PCT Patent Application No. PCT/JP2022/035973, mailed on Dec. 13, 2022, 2 pages.

*Primary Examiner* — John W Poos
(74) *Attorney, Agent, or Firm* — ArentFox Schiff LLP

(57) ABSTRACT

A tracker module is provided that includes a module laminate and an integrated circuit on the module laminate. The integrated circuit includes a switch unit included in an output switch circuit that selectively outputs at least one of multiple discrete voltages based on a first digital control signal. The first digital control signal includes a digital control line/logic signal indicating one of the multiple discrete voltages. The module laminate includes multiple lines and a ground electrode. The lines are connected to the integrated circuit and the first digital control signal flows through the lines. The ground electrode is connected to a ground terminal. In a sectional view of the module laminate, at least part of the lines is disposed between the integrated circuit and a ground electrode. In a plan view of the module laminate, at least part of the lines matches the ground electrode.

20 Claims, 15 Drawing Sheets

(58) Field of Classification Search

CPC ......... H03F 2200/504; H03F 2200/511; H03F 1/025; H03F 1/0222; H03F 3/195; H03F 3/193; H03F 2200/537; H03F 3/005; H03F 2200/541; H03F 2203/21139; H03F 2203/21142; H03F 2203/21106; H03F 2200/534; H03F 2203/7236; H03F 2203/7221; H03F 1/0266; H03F 2200/429; H03F 2200/318; H03F 2200/222; H03F 2200/294; H03F 1/565; H03F 2200/411; H03F 1/0288; H03F 2200/387; H03F 1/02; H03F 3/68; H03F 3/213; H03F 1/56; H03F 1/0277; H03F 2200/111; H03F 3/19; H03F 3/24; H03F 2203/7209; H03F 3/211; H03F 3/72; H03F 2200/102; H03F 1/0227; H10W 42/00; H10W 44/20; H10W 90/00; H10W 90/754; H10W 44/234; H10W 72/932; H10W 44/248; H10W 72/5449; H10W 90/724; H10W 44/206; H10W 74/00; H10W 72/884; H10W 44/251; H10W 44/209; H10W 70/656; H10W 72/252; H10W 72/877; H10W 72/879; H10W 90/271; H10W 90/28; H10W 90/732; H10W 90/752; H10W 90/753; H10W 42/20; H10W 72/59; H10W 44/231; H10W 72/00; H10W 20/40; H10W 20/42; H10W 20/427; H10W 44/226; H10W 44/501; H10W 44/601; H10W 70/65; H10W 72/07253; H10W 72/20; H10W 72/232; H10W 72/90; H10W 70/611; H10W 70/685; H10W 42/276; H10W 44/255; H10W 72/075; H10W 72/536; H10W 72/5363; H10W 72/552; H10W 72/5522; H10W 72/5525; H10W 72/952; H10W 74/114; H10W 90/734; H10W 90/755; H10W 40/22; H10W 44/203; H10W 90/10; H10W 90/22; H04B 1/04; H04B 1/40; H04B 1/0458; H04B 2001/0408; H04B 1/0475; H04B 1/005; H04B 1/1638; H04B 7/0617; H04B 1/0064; H04B 1/44; H04B 1/401; H04B 1/3827; H04B 1/54; H04B 1/0075; H04B 1/0483; H04B 1/006; H04B 1/1615; H04B 7/0413; H04B 7/0608; H04B 1/0053; H04B 1/0057; H04B 1/0089; H04B 1/0096; H04B 1/18; H04B 1/3833; H04B 2001/0416; H04B 2001/0425; H04B 7/0479; H04B 7/086; H04B 1/1607; H04B 17/102; H04B 17/13; H04B 2001/0433; H04B 2001/045; H04B 7/0408; H04B 7/0602; H04B 7/0671; H04B 7/082

See application file for complete search history.

(56) References Cited

U.S. PATENT DOCUMENTS

| | | | | |
|---|---|---|---|---|
| 9,755,672 | B2 | 9/2017 | Perreault et al. | |
| 10,666,200 | B2 | 5/2020 | Gebeyehu et al. | |
| 10,958,218 | B2 | 3/2021 | Gebeyehu et al. | |
| 11,394,347 | B2 | 7/2022 | Gebeyehu et al. | |
| 11,728,773 | B2 | 8/2023 | Gebeyehu et al. | |
| 2013/0250536 | A1 | 9/2013 | Satake | |
| 2014/0118063 | A1 | 5/2014 | Briffa et al. | |
| 2018/0316311 | A1 | 11/2018 | Gebeyehu et al. | |
| 2020/0336108 | A1 | 10/2020 | Gebeyehu et al. | |
| 2020/0350878 | A1 | 11/2020 | Drogi et al. | |
| 2020/0381996 | A1* | 12/2020 | Khlat | H03F 3/19 |
| 2021/0036604 | A1* | 2/2021 | Khlat | H02M 3/07 |
| 2021/0184632 | A1 | 6/2021 | Gebeyehu et al. | |
| 2022/0311386 | A1 | 9/2022 | Gebeyehu et al. | |
| 2022/0385314 | A1* | 12/2022 | Kogure | H03F 3/245 |
| 2024/0333150 | A1* | 10/2024 | Hoversten | H03F 1/02 |

FOREIGN PATENT DOCUMENTS

| | | | |
|---|---|---|---|
| JP | 2020-516194 | A | 5/2022 |
| WO | 2012/070540 | A1 | 5/2012 |

* cited by examiner

TRACKER MODULE AND COMMUNICATION DEVICE

CROSS REFERENCE TO RELATED APPLICATIONS

This application is a continuation of International Application No. PCT/JP2022/035973, filed Sep. 27, 2022, which claims priority to Japanese Patent Application No. 2021-159812, filed Sep. 29, 2021, the entire contents of each of which are hereby incorporated by reference in their entirety.

TECHNICAL FIELD

The present disclosure relates to a tracker module and a communication device.

BACKGROUND

U.S. Pat. No. 9,755,672 (hereinafter "Patent Document 1") discloses a power supply modulator circuit (e.g., an envelope tracking system) that supplies a power supply voltage to a power amplifier circuit based on an envelope signal. This power supply modulator circuit includes a magnetic converter circuit (Magnetic Regulation Stage: pre-regulator circuit) that converts a voltage, a switched-capacitor circuit (Switched-Capacitor Voltage Balancer Stage) that generates multiple voltages having different voltage levels from the converted voltage, and an output switch circuit (Output Switching Stage) that selects and outputs at least one of the multiple voltages. The switched-capacitor circuit includes switches and capacitors. The output switch circuit includes switches.

In the power supply modulator circuit disclosed in Patent Document 1, the output switch circuit includes a digital control line to select and output, based on the envelope signal, at least one of the above-described multiple voltages at high speed. When a tracker module is formed by using this output switch circuit, digital noise generated from the digital control line creates a noise source for peripheral circuits.

SUMMARY OF THE INVENTION

In view of the foregoing, the exemplary aspects of the present disclosure provide a tracker module and a communication device that reduces the occurrence of noise.

According to an exemplary aspect, a tracker module is provided that includes a module laminate and an integrated circuit disposed on the module laminate. The integrated circuit includes a switch unit included in an output switch circuit. Based on a first digital control signal, the output switch circuit is configured to selectively output at least one of multiple discrete voltages generated based on an input voltage. The first digital control signal includes a digital control line/logic signal indicating one of the multiple discrete voltages. The module laminate includes a first control line and a metal member. The first control line is connected to the integrated circuit and the first digital control signal flows through the first control line. The metal member is connected to a ground terminal. In a sectional view of the module laminate, at least part of the first control line is disposed between the integrated circuit and the metal member. In a plan view of the module laminate, at least part of the first control line matches the metal member.

According to another exemplary aspect, a tracker module is provided that includes a module laminate and first and second circuits. The first circuit includes a first capacitor including first and second electrodes, a second capacitor including third and fourth electrodes, and first, second, third, fourth, fifth, sixth, seventh, and eighth switches. A first end of the first switch and a first end of the third switch are connected to the first electrode. A first end of the second switch and a first end of the fourth switch are connected to the second electrode. A first end of the fifth switch and a first end of the seventh switch are connected to the third electrode. A first end of the sixth switch and a first end of the eighth switch are connected to the fourth electrode. The second end of the first switch, the second end of the second switch, the second end of the fifth switch, and the second end of the sixth switch are connected to each other. Moreover, the second end of the third switch is connected to the second end of the seventh switch. The second end of the fourth switch is connected to the second end of the eighth switch. The second circuit includes a first output terminal and ninth and tenth switches. The ninth switch is connected between the first output terminal and each of the second ends of the first switch, the second switch, the fifth switch, and the sixth switch. The tenth switch is connected between the first output terminal and each of the second ends of the third and seventh switches. The ninth and tenth switches are included in an integrated circuit. The module laminate includes a first control line and a metal member. The first control line is connected to the integrated circuit. A first digital control signal including a digital control line/logic signal flows through the first control line. The metal member is connected to a ground terminal. In a sectional view of the module laminate, at least part of the first control line is disposed between the integrated circuit and the metal member. In a plan view of the module laminate, at least part of the first control line matches the metal member.

According to the exemplary aspects of the present disclosure, a tracker module and a communication device are provided that reduce the occurrence of noise.

DETAILED DESCRIPTION

Figure 1:
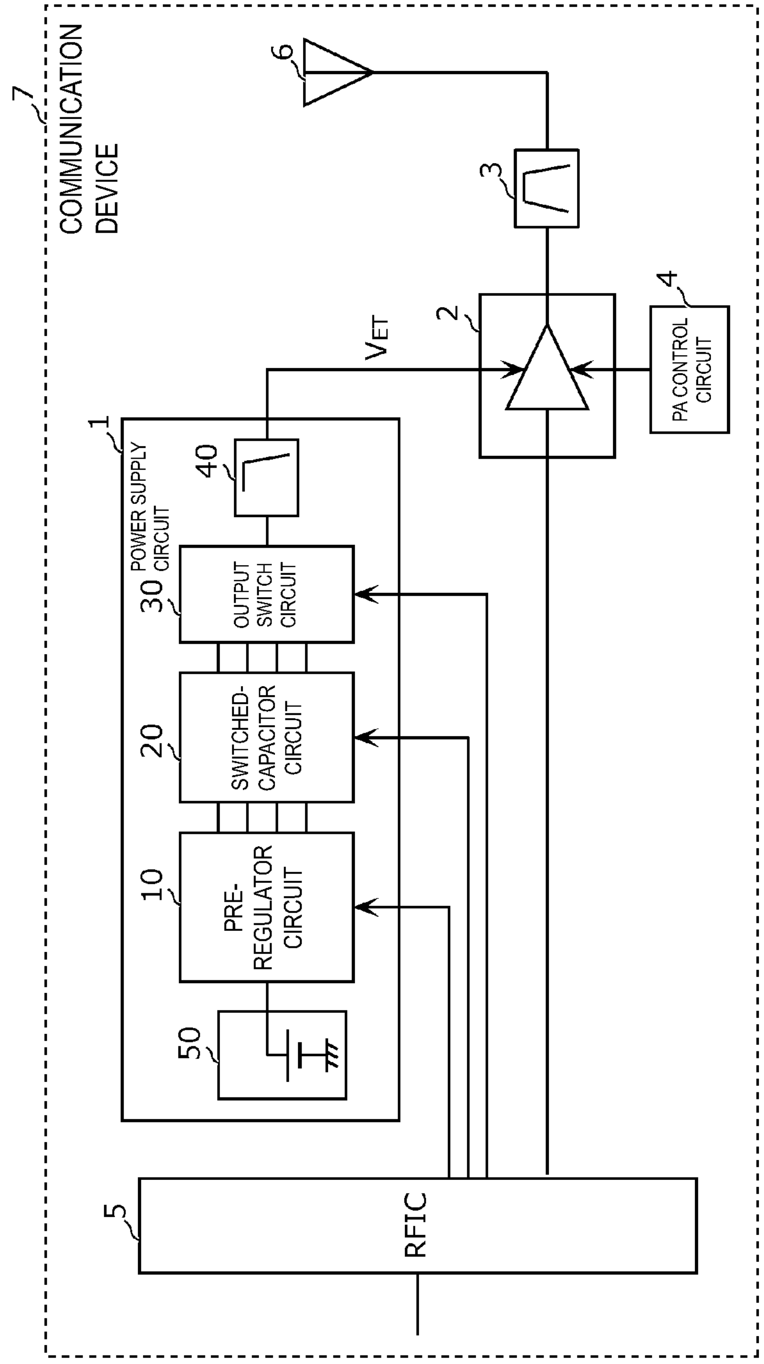
FIG. 1 is a circuit block diagram of a power supply circuit and a communication device according to an exemplary embodiment.

Exemplary embodiments of the present disclosure will be described below in detail with reference to the drawings. All the embodiments described below illustrate general or specific examples. Numerical values, configurations, materials, elements, and positions and connection states of the elements, for example, illustrated in the following embodiments are only examples and are not intended to limit the exemplary aspects of the present invention.

In addition, the drawings are only schematically shown and are not necessarily precisely illustrated. For the sake of representation of the exemplary aspects, the drawings are illustrated in an exaggerated manner or with omissions or the ratios of elements in the drawings are adjusted. The shapes, positional relationships, and ratios of elements in the drawings may be different from those of the actual elements. In the drawings, substantially identical elements are designated by like reference numeral and an explanation of such elements may be omitted or be merely simplified from the second time.

In the individual drawings, the x axis and the y axis are axes which are perpendicular to each other on a plane parallel with the main surfaces of a module laminate. More specifically, if the module laminate has a rectangular shape in a plan view according to an exemplary aspect, the x axis is parallel with a first side of the module laminate, while the y axis is parallel with a second side, which is perpendicular to the first side, of the module laminate. The z axis is an axis perpendicular to the main surfaces of the module laminate. The positive direction of the z axis is the top direction, while the negative direction of the z axis is the bottom direction.

In the following embodiments and for purposes of this disclosure, the phrase "A is connected to B" includes, not only the meaning that A is directly connected to B using a connection terminal and/or a wiring conductor, but also the meaning that A is electrically connected to B via another circuit element. Moreover, the phrase "an element is connected between A and B" means that the element is connected to both A and B between A and B and includes the meaning that the element is connected in series with a path connecting A and B.

In the layout of components in the exemplary aspects, the phrase "A is disposed on a main surface of a module laminate" includes the meaning that A is directly mounted on this main surface. There is a space close to this main surface and a space close to the opposite main surface with the module laminate interposed therebetween. Moreover, the phrase "A is disposed on a main surface of a module laminate" also includes the meaning that A is disposed in the space close to the above-described main surface, namely, A is mounted on this main surface via another circuit component or electrode.

In the layout of components in the exemplary aspect, the phrase "in a plan view" means that an object is orthographically projected on an xy plane from the positive side of the z axis and is viewed from this side. In the layout of components in the exemplary aspect, the phrase "in a sectional view" means that a cross section of a tracker module is seen from the x-axis or y-axis direction.

In the layout of components in the exemplary aspects, the phrase "A and B are adjacent to each other" means that A and B are disposed close to each other, and more specifically, no circuit component is disposed in a space between A and B. In other words, none of multiple line segments from a certain point on a surface of A facing B until B along a direction normal to this surface passes through circuit components other than A and B. The circuit components include active components, such as transistors and diodes, and passive components, such as inductors, transformers, capacitors, and resistors, and do not include terminals, connectors, electrodes, wiring, and resin members.

It is also noted that in the present disclosure, terms representing the relationship between elements, such as "being parallel" and "being vertical", and terms representing the shape of an element, such as "being rectangular", are not necessarily to be interpreted in an exact sense, but to be interpreted in a broad sense. That is, such terms also cover substantially equivalent ranges, such as about several percent of allowance.

In the present disclosure, the term "signal path" means a transmission line formed by elements, such as a line for transferring a radio-frequency signal therethrough, an electrode directly connected to this line, and a terminal directly connected to this line or this electrode.

EXEMPLARY EMBODIMENTS

1 Circuit Configurations of Power Supply Circuit 1 and Communication Device 7

The circuit configurations of a power supply circuit 1 and a communication device 7 according to an embodiment will be described below with reference to FIG. 1. FIG. 1 is a circuit block diagram of the power supply circuit 1 and the communication device 7 according to the embodiment.

[1.1 Circuit Configuration of Communication Device 7]

The circuit configuration of the communication device 7 will first be described below. As illustrated in FIG. 1, the communication device 7 according to the embodiment includes a power supply circuit 1, a power amplifier circuit 2, a filter 3, a PA control circuit 4, an RFIC (Radio Frequency Integrated Circuit) 5, and an antenna 6.

The power supply circuit 1 includes a pre-regulator circuit 10, a switched-capacitor circuit 20, an output switch circuit 30, a filter circuit 40, and a direct current (DC) power source 50.

The power supply circuit 1 is configured to supply a power supply voltage $V_{ET}$ to the power amplifier circuit 2 in a digital envelope tracking (ET) mode. More specifically, the power supply circuit 1 supplies a power supply voltage $V_{ET}$ having a power supply voltage level, which is selected from multiple discrete voltage levels based on an envelope signal, to the power amplifier circuit 2. The digital ET mode will be discussed later with reference to FIGS. 3A and 3B. In FIG. 1, the power supply circuit 1 supplies one power supply voltage $V_{ET}$ to one power amplifier circuit 2. However, the power supply circuit 1 may individually supply multiple power supply voltages to plural power amplifiers.

The envelope signal is a signal indicating the envelope of a radio-frequency input signal (modulated signal). The envelope value is represented by $\sqrt{(i^2+Q^2)}$, for example. (I, Q) is a constellation point. The constellation point is a point of a digital modulated signal on a constellation diagram. (I, Q) is determined by a BBIC based on transmission information, for example.

Tracking the envelope of a radio-frequency signal by the use of multiple discrete voltage levels within a frame will be called digital envelope tracking (hereinafter called "digital ET"), and a mode in which digital ET is applied to a power supply voltage will be called a digital ET mode. Tracking the envelope of a radio-frequency signal by the use of continuous voltage levels will be called analog envelope tracking (hereinafter called "analog ET"), and a mode in which analog ET is applied to a power supply voltage will be called an analog ET mode.

For purposes of this disclosure, a frame is a unit which forms a radio-frequency signal (e.g., a modulated signal). For example, 5GNR (5th Generation New Radio) and LTE (Long Term Evolution) define that a frame includes ten subframes, each subframe includes plural slots, and each slot is formed by plural symbols. The subframe length is 1 ms, and the frame length is 10 ms.

The digital ET mode and the analog ET mode will be explained later with reference to FIGS. 3A and 3B.

The pre-regulator circuit 10 is an example of a third circuit and includes a power inductor and switches. The power inductor is an inductor used for stepping-up and/or stepping-down a DC voltage. The power inductor is disposed in series with a DC path. The pre-regulator circuit 10 is configured to convert an input voltage (third voltage) into a first voltage by using the power inductor. The pre-regulator circuit 10 configured as described above may also be called a magnetic regulator or a DC (Direct Current)-to-DC converter. The power inductor may be connected between the DC path and a ground. In other words, the power inductor may be connected in parallel with the DC path.

The provision of a power inductor for the pre-regulator circuit 10 may be omitted. For example, the pre-regulator circuit 10 may be a circuit that steps-up a voltage by switching a capacitor disposed on a series arm path and the use of a capacitor disposed on a parallel arm path of the pre-regulator circuit 10.

The switched-capacitor circuit 20 is an example of a first circuit. The switched-capacitor circuit 20 includes plural capacitors and plural switches and is configured to generate multiple second voltages having the respective discrete voltage levels from the first voltage supplied from the pre-regulator circuit 10. The switched-capacitor circuit 20 may also be called a switched-capacitor voltage balancer.

The output switch circuit 30 is an example of a second circuit. Based on a digital control signal corresponding to an envelope signal, the output switch circuit 30 is configured to selectively output at least one of the multiple discrete voltages (multiple second voltages) generated by the switched-capacitor circuit 20 to the filter circuit 40. As a result, at least one voltage selected from the multiple discrete voltages is output from the output switch circuit 30. In this manner, the output switch circuit 30 repeatedly selects a voltage over time so as to change the output voltage over time.

It is noted that the output switch circuit 30 can include various circuit elements and/or lines that cause a voltage drop and/or noise, for example. Hence, the time waveform of the output voltage from the output switch circuit 30 is not necessarily a rectangular wave including only multiple discrete voltages. That is, the output voltage from the output switch circuit 30 can include a voltage, which is none of the multiple discrete voltages, according to an exemplary aspect.

The filter circuit 40 is an example of a fourth circuit and is configured to filter signals (second voltages) received from the output switch circuit 30. The filter circuit 40 is formed by a low pass filter (LPF), for example.

The DC power source 50 can supply a DC voltage to the pre-regulator circuit 10. As the DC power source 50, a rechargeable battery, for example, may be used, but the DC power source 50 is not restricted thereto in alternative aspects.

The provision of at least one of the pre-regulator circuit 10, filter circuit 40, and DC power source 50 for the power supply circuit 1 may be omitted. For example, the provision of the filter circuit 40 and the DC power source 50 for the power supply circuit 1 may be omitted. A desired combination of the pre-regulator circuit 10, switched-capacitor circuit 20, output switch circuit 30, and filter circuit 40 may be integrated into a single circuit. An example of the detailed circuit configuration of the power supply circuit 1 will be discussed later with reference to FIG. 2.

The power amplifier circuit 2 is connected between the RFIC 5 and the filter 3. The power amplifier circuit 2 amplifies a radio-frequency transmission signal (hereinafter called a "transmission signal") of a predetermined band output from the RFIC 5 and outputs the amplified transmission signal to the antenna 6 via the filter 3.

In response to a control signal received from the RFIC 5, the PA control circuit 4 controls the magnitude and the supply timing of a bias current (or a bias voltage) to be supplied to the power amplifier circuit 2.

The filter 3 is connected between the power amplifier circuit 2 and the antenna 6. The filter 3 has a pass band including a predetermined band so as to allow a transmission signal of the predetermined band amplified by the power amplifier circuit 2 to pass through the filter 3.

The antenna 6 is connected to the output side of the power amplifier circuit 2 and transmits a transmission signal of the predetermined band output from the power amplifier circuit 2.

The RFIC 5 is an example of a signal processing circuit that processes a radio-frequency signal. More specifically, the RFIC 5 performs signal processing, such as up-conversion, on a transmission signal received from a BBIC (baseband signal processing circuit: not shown) and outputs the resulting transmission signal to the power amplifier circuit 2.

The RFIC 5 is also an example of a control circuit and includes a controller that controls the power supply circuit 1 and the power amplifier circuit 2. Based on the envelope signal of a radio-frequency input signal obtained from the BBIC, the RFIC 5 causes the output switch circuit 30 to select the voltage level of the power supply voltage $V_{ET}$ to be used in the power amplifier circuit 2 from among multiple discrete voltage levels generated in the switched-capacitor circuit 20. With this configuration, the power supply circuit 1 outputs the power supply voltage $V_{ET}$ based on digital ET.

All or some of the functions of the RFIC 5 as the controller may be disposed outside the RFIC 5, such as in the BBIC or the power supply circuit 1. For example, a control function of selecting the above-described power supply voltage V may be included in the power supply circuit 1 instead of the RFIC 5.

It is noted that the communication device 7 shown in FIG. 1 is only an example and the communication device 7 is not restricted to that shown in FIG. 1. For example, the provision of the filter 3, PA control circuit 4, and antenna 6 for the communication device 7 may be omitted in an alternative aspect. In another example, the communication device 7 may have a receive path including a low-noise amplifier and a receive filter. In another example, the communication device 7 may include plural power amplifier circuits corresponding to different bands.

[1.2 Circuit Configuration of Power Supply Circuit 1]

Figure 2:
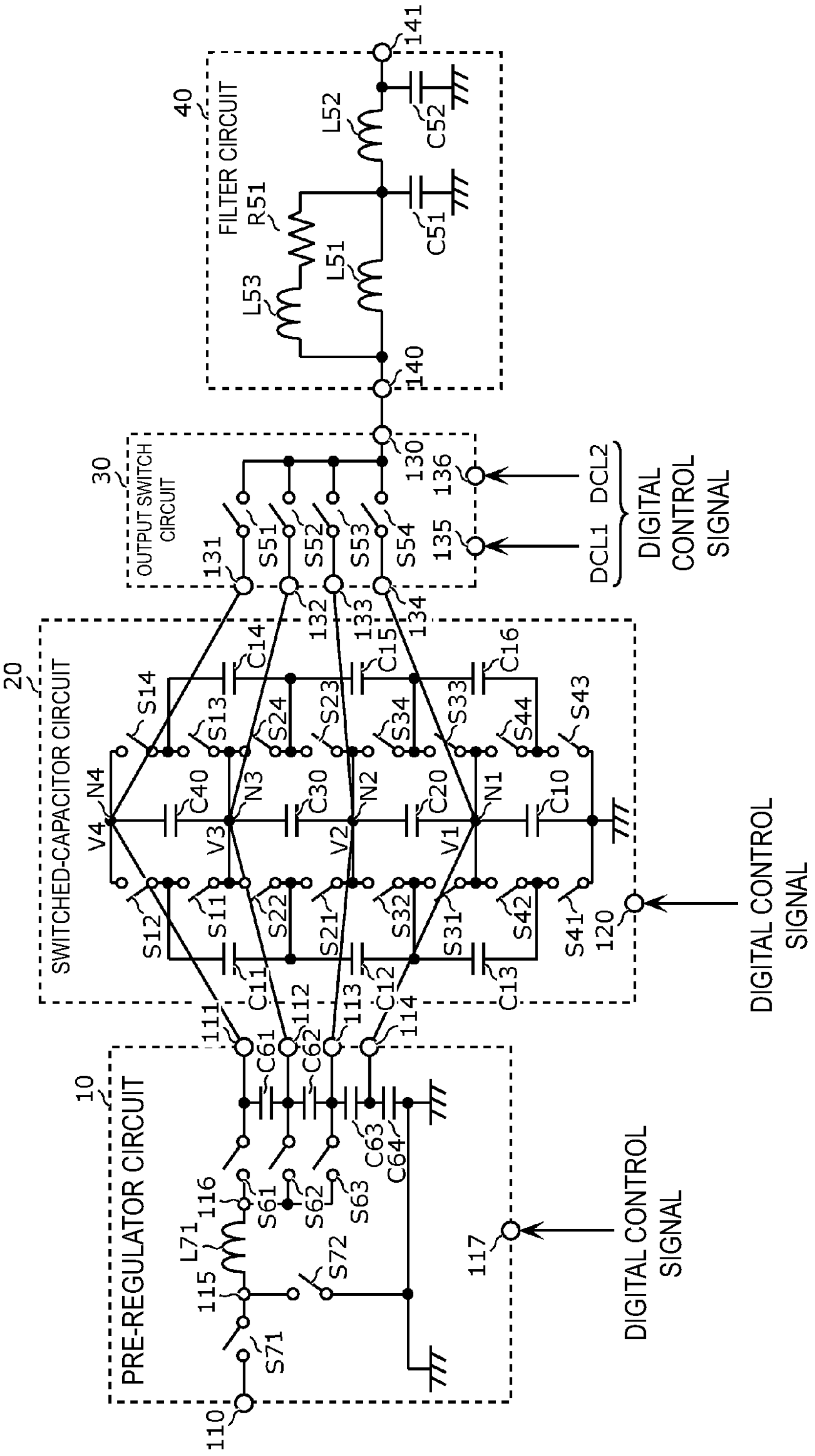
FIG. 2 illustrates a circuit configuration of the power supply circuit according to the exemplary embodiment.

The circuit configurations of the pre-regulator circuit 10, switched-capacitor circuit 20, output switch circuit 30, and filter circuit 40 included in the power supply circuit 1 will now be described below with reference to FIG. 2. FIG. 2 illustrates an example of the circuit configuration of the power supply circuit 1 according to the embodiment.

The circuit configuration shown in FIG. 2 is only an example, and the pre-regulator circuit 10, switched-capacitor circuit 20, output switch circuit 30, and filter circuit 40 can be implemented by using any of a variety of circuit implementations and circuit technologies. Hence, the following explanations of the pre-regulator circuit 10, switched-capacitor circuit 20, output switch circuit 30, and filter circuit 40 are not to be interpreted in a limited manner.

[1.2.1 Circuit Configuration of Switched-Capacitor Circuit 20]

The circuit configuration of the switched-capacitor circuit 20 will first be discussed below. As illustrated in FIG. 2, the switched-capacitor circuit 20 includes capacitors C11, C12, C13, C14, C15, C16, capacitors C10, C20, C30, and C40, and switches S11, S12, S13, S14, S21, S22, S23, S24, S31, S32, S33, S34, S41, S42, S43, and S44, and a control terminal 120.

The control terminal 120 is an input terminal for a second digital control signal. That is, the control terminal 120 is a terminal for receiving a second digital control signal for controlling the switched-capacitor circuit 20. As the second digital control signal to be received via the control terminal 120, a control signal based on a source synchronous system to transmit a data signal and a clock signal, for example, may be used. However, another system may be used. For instance, a clock-in-embedded system may be used for the digital control signal in an alternative aspect.

The capacitors C11 through C16 each serve as a flying capacitor (may also be called a transfer capacitor). That is, each of the capacitors C11 through C16 is used for stepping up or stepping down the first voltage supplied from the pre-regulator circuit 10. More specifically, the capacitors C11 through C16 transfer electric charge between the capacitors C11 through C16 and nodes N1 through N4 so that voltages V1 through V4 (voltages with respect to a ground potential) which satisfy the relationship of V1:V2:V3:V4=1:2:3:4 can be maintained at the nodes N1 through N4, respectively. The voltages V1 through V4 correspond to multiple second voltages having the respective discrete voltage levels.

The capacitor C11 has two electrodes. One of the two electrodes of the capacitor C11 is connected to one end of the switch S11 and one end of the switch S12. The other one of the two electrodes of the capacitor C11 is connected to one end of the switch S21 and one end of the switch S22. For purposes of this disclosure the term "one end" may generally be considered a "first end" and the term "another end" or the "other end" may generally be considered a "second end". These terms for such components may be interchangeable as would be appreciated to one skilled in the art.

The capacitor C12 is an example of a first capacitor and has two electrodes (an example of a first electrode and a second electrode). One of the two electrodes of the capacitor C12 is connected to one end of the switch S21 and one end of the switch S22. The other one of the two electrodes of the capacitor C12 is connected to one end of the switch S31 and one end of the switch S32.

The capacitor C13 has two electrodes. One of the two electrodes of the capacitor C13 is connected to one end of the switch S31 and one end of the switch S32. The other one of the two electrodes of the capacitor C13 is connected to one end of the switch S41 and one end of the switch S42.

The capacitor C14 has two electrodes. One of the two electrodes of the capacitor C14 is connected to one end of the switch S13 and one end of the switch S14. The other one of the two electrodes of the capacitor C14 is connected to one end of the switch S23 and one end of the switch S24.

The capacitor C15 is an example of a second capacitor and has two electrodes (an example of a third electrode and a fourth electrode). One of the two electrodes of the capacitor C15 is connected to one end of the switch S23 and one end of the switch S24. The other one of the two electrodes of the capacitor C15 is connected to one end of the switch S33 and one end of the switch S34.

The capacitor C16 has two electrodes. One of the two electrodes of the capacitor C16 is connected to one end of the switch S33 and one end of the switch S34. The other one of the two electrodes of the capacitor C16 is connected to one end of the switch S43 and one end of the switch S44.

The capacitors C11 and C13 are also examples of the first capacitor. The capacitors C14 and C16 are also examples of the second capacitor.

As a result of repeating a first phase and a second phase, a set of the capacitors C11 and C14, a set of the capacitors C12 and C15, and a set of the capacitors C13 and C16 can each complementarily perform charging and discharging.

More specifically, in the first phase, the switches S12, S13, S22, S23, S32, S33, S42, and S43 are ON. As a result, for example, one of the two electrodes of the capacitor C12 is connected to the node N3, the other one of the two electrodes of the capacitor C12 and one of the two electrodes of the capacitor C15 are connected to the node N2, and the other one of the two electrodes of the capacitor C15 is connected to the node N1.

In the second phase, the switches S11, S14, S21, S24, S31, S34, S41, and S44 are ON. As a result, for example, one of the two electrodes of the capacitor C15 is connected to the node N3, the other one of the two electrodes of the capacitor C15 and one of the two electrodes of the capacitor C12 are connected to the node N2, and the other one of the two electrodes of the capacitor C12 is connected to the node N1.

As a result of repeating the first phase and the second phase, when, for example, one of the capacitors C12 and C15 is being charged from the node N2, the other one of the capacitors C12 and C15 can discharge to the capacitor C30. That is, the capacitors C12 and C15 can complementarily perform charging and discharging. The capacitors C12 and C15 are a pair of flying capacitors that complementarily perform charging and discharging.

As in the set of the capacitors C12 and C15, as a result of suitably switching the switches, a set of one of the capacitors C11, C12, and C13 (e.g., a first capacitor) and one of the capacitors C14, C15, and C16 (e.g., a second capacitor) also serves as a pair of flying capacitors that complementarily perform charging from a corresponding node and discharging to a smoothing capacitor.

The capacitors C10, C20, C30, and C40 each serve as a smoothing capacitor. That is, the capacitors C10, C20, C30, and C40 are respectively used for holding and smoothing the voltages V1 through V4 at the nodes N1 through N4.

The capacitor C10 is an example of a third capacitor and is connected between the node N1 and a ground. More specifically, one (fifth electrode) of two electrodes of the capacitor C10 is connected to the node N1, while the other one (sixth electrode) of the two electrodes of the capacitor C10 is connected to a ground.

The capacitor C20 is connected between the nodes N2 and N1. More specifically, one of two electrodes of the capacitor C20 is connected to the node N2, while the other one of the two electrodes of the capacitor C20 is connected to the node N1.

The capacitor C30 is connected between the nodes N3 and N2. More specifically, one of two electrodes of the capacitor C30 is connected to the node N3, while the other one of the two electrodes of the capacitor C30 is connected to the node N2.

The capacitor C40 is connected between the nodes N4 and N3. More specifically, one of two electrodes of the capacitor C40 is connected to the node N4, while the other one of the two electrodes of the capacitor C40 is connected to the node N3.

The switch S11 is connected between one of the two electrodes of the capacitor C11 and the node N3. More specifically, one end of the switch S11 is connected to one of the two electrodes of the capacitor C11, while the other end of the switch S11 is connected to the node N3.

The switch S12 is connected between one of the two electrodes of the capacitor C11 and the node N4. More specifically, one end of the switch S12 is connected to one of the two electrodes of the capacitor C11, while the other end of the switch S12 is connected to the node N4.

The switch S21 is an example of a first switch and is connected between one of the two electrodes of the capacitor C12 and the node N2. More specifically, one end of the switch S21 is connected to one of the two electrodes of the capacitor C12 and the other one of the two electrodes of the capacitor C11, while the other end of the switch S21 is connected to the node N2.

The switch S22 is an example of a third switch and is connected between one of the two electrodes of the capacitor C12 and the node N3. More specifically, one end of the switch S22 is connected to one of the two electrodes of the capacitor C12 and the other one of the two electrodes of the capacitor C11, while the other end of the switch S22 is connected to the node N3.

The switch S31 is an example of a fourth switch and is connected between the other one of the two electrodes of the capacitor C12 and the node N1. More specifically, one end of the switch S31 is connected to the other one of the two electrodes of the capacitor C12 and one of the two electrodes of the capacitor C13, while the other end of the switch S31 is connected to the node N1.

The switch S32 is an example of a second switch and is connected between the other one of the two electrodes of the capacitor C12 and the node N2. More specifically, one end of the switch S32 is connected to the other one of the two electrodes of the capacitor C12 and one of the two electrodes of the capacitor C13, while the other end of the switch S32 is connected to the node N2. That is, the other end of the switch S32 is connected to the other end of the switch S21.

The switch S41 is connected between the other one of the two electrodes of the capacitor C13 and a ground. More specifically, one end of the switch S41 is connected to the other one of the two electrodes of the capacitor C13, while the other end of the switch S41 is connected to a ground.

The switch S42 is connected between the other one of the two electrodes of the capacitor C13 and the node N1. More specifically, one end of the switch S42 is connected to the other one of the two electrodes of the capacitor C13, while the other end of the switch S42 is connected to the node N1. That is, the other end of the switch S42 is connected to the other end of the switch S31.

The switch S13 is connected between one of the two electrodes of the capacitor C14 and the node N3. More specifically, one end of the switch S13 is connected to one of the two electrodes of the capacitor C14, while the other end of the switch S13 is connected to the node N3. That is, the other end of the switch S13 is connected to the other end of the switch S11 and the other end of the switch S22.

The switch S14 is connected between one of the two electrodes of the capacitor C14 and the node N4. More specifically, one end of the switch S14 is connected to one of the two electrodes of the capacitor C14, while the other end of the switch S14 is connected to the node N4. That is, the other end of the switch S14 is connected to the other end of the switch S12.

The switch S23 is an example of a fifth switch and is connected between one of the two electrodes of the capacitor C15 and the node N2. More specifically, one end of the switch S23 is connected to one of the two electrodes of the capacitor C15 and the other one of the two electrodes of the capacitor C14, while the other end of the switch S23 is connected to the node N2. That is, the other end of the switch S23 is connected to the other end of the switch S21 and the other end of the switch S32.

The switch S24 is an example of a seventh switch and is connected between one of the two electrodes of the capacitor C15 and the node N3. More specifically, one end of the switch S24 is connected to one of the two electrodes of the capacitor C15 and the other one of the two electrodes of the capacitor C14, while the other end of the switch S24 is connected to the node N3. That is, the other end of the switch S24 is connected to the other end of the switch S11, the other end of the switch S22, and the other end of the switch S13.

The switch S33 is an example of an eighth switch and is connected between the other one of the two electrodes of the capacitor C15 and the node N1. More specifically, one end of the switch S33 is connected to the other one of the two electrodes of the capacitor C15 and one of the two electrodes of the capacitor C16, while the other end of the switch S33 is connected to the node N1. That is, the other end of the switch S33 is connected to the other end of the switch S31 and the other end of the switch S42.

The switch S34 is an example of a sixth switch and is connected between the other one of the two electrodes of the capacitor C15 and the node N2. More specifically, one end of the switch S34 is connected to the other one of the two electrodes of the capacitor C15 and one of the two electrodes of the capacitor C16, while the other end of the switch S34 is connected to the node N2. That is, the other end of the switch S34 is connected to the other end of the switch S21, the other end of the switch S32, and the other end of the switch S23.

The switch S43 is connected between the other one of the two electrodes of the capacitor C16 and a ground. More specifically, one end of the switch S43 is connected to the other one of the two electrodes of the capacitor C16, while the other end of the switch S43 is connected to a ground.

The switch S44 is connected between the other one of the two electrodes of the capacitor C16 and the node N1. More specifically, one end of the switch S44 is connected to the other one of the two electrodes of the capacitor C16, while the other end of the switch S44 is connected to the node N1. That is, the other end of the switch S44 is connected to the other end of the switch S31, the other end of the switch S42, and the other end of the switch S33.

The ON/OFF state of a first set of switches including the switches S12, S13, S22, S23, S32, S33, S42, and S43 and the ON/OFF state of a second set of switches including the switches S11, S14, S21, S24, S31, S34, S41, and S44 are switched therebetween in a complementary manner. More specifically, in the first phase, the switches included in the first set are ON, while the switches included in the second set are OFF. Conversely, in the second phase, the switches included in the first set are OFF, while the switches included in the second set are ON.

For example, in one of the first phase and the second phase, the capacitors C11 through C13 charge the capacitors C10 through C40, and in the other one of the first phase and the second phase, the capacitors C14 through C16 charge the capacitors C10 through C40. That is, the capacitors C10 through C40 are constantly charged from the capacitors C11 through C13 or from the capacitors C14 through C16. Hence, even if a current flows from the nodes N1 through N4 to the output switch circuit 30 at high speed, the nodes N1 through N4 are recharged quickly, thereby reducing potential variations at the nodes N1 through N4.

According to the exemplary aspect, the switched-capacitor circuit 20 is operated in this manner so as to maintain a substantially equal voltage across each of the capacitors C10, C20, C30, and C40. More specifically, at the nodes N1 through N4 labeled with V1 through V4, respectively, the voltages V1 through V4 (voltages with respect to a ground potential) which satisfy the relationship of V1:V2:V3:V4=1:2:3:4 can be maintained. The voltage levels of the voltages V1 through V4 correspond to the voltage levels of multiple discrete voltages that are supplied from the switched-capacitor circuit 20 to the output switch circuit 30.

It is noted that the voltage ratio V1:V2:V3:V4 is not limited to 1:2:3:4. For example, the voltage ratio V1:V2:V3:V4 may be 1:2:4:8 in an alternative aspect.

It is noted that the configuration of the switched-capacitor circuit 20 is not limited to that shown in FIG. 2, which illustrates only an example of the configuration of the switched-capacitor circuit 20. Although the switched-capacitor circuit 20 shown in FIG. 2 is configured to supply voltages of four discrete voltage levels, the number of discrete voltage levels is not limited to four. In addition, the switched-capacitor circuit 20 may be configured to supply voltages of any number of multiple (two or more) discrete voltage levels. For example, the switched-capacitor circuit 20 may be configured to supply voltages of two discrete voltage levels, and thus it may include at least the capacitors C12 and C15 and switches S21, S22, S31, S32, S23, S24, S33, and S34.

[1.2.2 Circuit Configuration of Output Switch Circuit 30]

The circuit configuration of the output switch circuit 30 will now be described below. As illustrated in FIG. 2, the output switch circuit 30 includes input terminals 131 through 134, switches S51, S52, S53, and S54, an output terminal 130, and a control terminal 135 and 136.

The output terminal 130 is connected to the filter circuit 40. The output terminal 130 is a terminal for supplying, as the power supply voltage $V_{ET}$, at least one voltage selected from among the voltages V1 through V4 to the power amplifier circuit 2 via the filter circuit 40. As stated above, the output switch circuit 30 can include various circuit elements and/or lines that cause a voltage drop and/or noise, for example. It is thus possible that the output voltage $V_{ET}$ found at the output terminal 130 includes a voltage, which is none of the voltages V1 through V4.

The input terminals 131 through 134 are connected to the nodes N4 through N1, respectively, of the switched-capacitor circuit 20. The input terminals 131 through 134 are terminals for receiving the voltages V4 through V1, respectively, from the switched-capacitor circuit 20.

The control terminals 135 and 136 are input terminals for a first digital control signal. That is, the control terminals 135 and 136 are terminals for receiving the first digital control signal indicating one of the voltages V1 through V4. The output switch circuit 30 controls the ON/OFF states of the switches 51 through 54 so as to select the voltage level indicated by the first digital control signal.

As the first digital control signal received via the control terminals 135 and 136, two digital control line/logic (DCL) signals can be used. Each of the DCL signals is a one-bit signal. The voltages V1 through V4 are each represented by a combination of two one-bit signals. For example, V1, V2, V3, and V4 are represented by "00", "01", "10", and "11", respectively. For the representation of the voltage level, Gray code may be used. In this case, two control terminals are used for receiving two DCL signals. As the number of DCL signals, any desired number (one or more) of DCL signals may be used in accordance with the number of voltage levels. The DCL signals may be multibit (two or more) signals. The first digital control signal may be formed by one or more DCL signals in an exemplary aspect. A control signal based on the source synchronous system may be used as the first digital control signal.

The switch S51 is connected between the input terminal 131 and the output terminal 130. More specifically, the switch S51 has a terminal connected to the input terminal 131 and a terminal connected to the output terminal 130. With this connection configuration, the switch S51 can switch its ON/OFF state so as to selectively connect the input terminal 131 to the output terminal 130 or disconnect the input terminal 131 from the output terminal 130.

The switch S52 is an example of a tenth switch and is connected between the input terminal 132 and the output terminal 130. More specifically, the switch S52 has a terminal connected to the input terminal 132 and a terminal connected to the output terminal 130. With this connection configuration, the switch S52 can switch its ON/OFF state so as to selectively connect the input terminal 132 to the output terminal 130 or disconnect the input terminal 132 from the output terminal 130.

The switch S53 is an example of a ninth switch and is connected between the input terminal 133 and the output terminal 130. More specifically, the switch S53 has a terminal connected to the input terminal 133 and a terminal connected to the output terminal 130. With this connection configuration, the switch S53 can switch its ON/OFF state so as to selectively connect the input terminal 133 to the output terminal 130 or disconnect the input terminal 133 from the output terminal 130.

The switch S54 is connected between the input terminal 134 and the output terminal 130. More specifically, the switch S54 has a terminal connected to the input terminal 134 and a terminal connected to the output terminal 130. With this connection configuration, the switch S54 can switch its ON/OFF state so as to selectively connect the input terminal 134 to the output terminal 130 or disconnect the input terminal 134 from the output terminal 130.

The switches S51 through S54 are controlled to be ON mutually exclusively. That is, only one of the switches S51 through S54 is turned ON, while the remaining switches are turned OFF. This enables the output switch circuit 30 to output one voltage selected from the voltages V1 through V4.

The configuration of the output switch circuit 30 is not limited to that shown in FIG. 2, which illustrates only an example of the configuration of the output switch circuit 30. Among others, the switches S51 through S54 may be configured in any manner such that they can selectively connect one of the four input terminals 131 through 134 to the output terminal 130. In one example, the output switch circuit 30 may include another switch between a set of the switches S51 through S53 and a group of the switch S54 and the output terminal 130. In another example, the output switch circuit 30 may include another switch between a set of the switches S51 and S52 and a group of the switches S53 and S54 and the output terminal 130.

In another example, when the output switch circuit 30 is configured to select one of the second voltages having two discrete voltage levels, it may include at least the switches S52 and S53.

In another example, the output switch circuit 30 may be configured to output two or more voltages. In this case, the output switch circuit 30 includes a required number of additional sets of switches similar to the set of switches S51 through S54 and a required number of additional output terminals.

[1.2.3 Circuit Configuration of Pre-Regulator Circuit 10]

The circuit configuration of the pre-regulator circuit 10 will now be described below. As illustrated in FIG. 2, the pre-regulator circuit 10 includes an input terminal 110, output terminals 111 through 114, inductor connection terminals 115 and 116, a control terminal 117, switches S61, S62, S63, S71, and S72, a power inductor L71, and capacitors C61, C62, C63, and C64.

The input terminal 110 is an example of a third input terminal and is an input terminal for a DC voltage. That is, the input terminal 110 is a terminal for receiving an input voltage from the DC power source 50.

The output terminal 111 is an output terminal for the voltage V4. That is, the output terminal 111 is a terminal for supplying the voltage V4 to the switched-capacitor circuit 20. The output terminal 111 is connected to the node N4 of the switched-capacitor circuit 20.

The output terminal 112 is an output terminal for the voltage V3. That is, the output terminal 112 is a terminal for supplying the voltage V3 to the switched-capacitor circuit 20. The output terminal 112 is connected to the node N3 of the switched-capacitor circuit 20.

The output terminal 113 is an output terminal for the voltage V2. That is, the output terminal 113 is a terminal for supplying the voltage V2 to the switched-capacitor circuit 20. The output terminal 113 is connected to the node N2 of the switched-capacitor circuit 20.

The output terminal 114 is an output terminal for the voltage V1. That is, the output terminal 114 is a terminal for supplying the voltage V1 to the switched-capacitor circuit 20. The output terminal 114 is connected to the node N1 of the switched-capacitor circuit 20.

The inductor connection terminal 115 is connected to one terminal of the power inductor L71. The inductor connection terminal 116 is connected to the other terminal of the power inductor L71.

The control terminal 117 is an input terminal for the second digital control signal. That is, the control terminal 117 is a terminal for receiving the second digital control signal for controlling the pre-regulator circuit 10. As the second digital control signal to be received via the control terminal 117, a control signal based on the source synchronous system to transmit a data signal and a clock signal, for example, may be used. However, another system may be used. For instance, the clock-in-embedded system for embedding a clock in a data signal may be used for the digital control signal. The control terminal 117 may be integrated into one terminal with the control terminal 120.

The switch S71 is an example of an eleventh switch and is connected between the input terminal 110 and one end of the power inductor L71. More specifically, the switch S71 has a terminal connected to the input terminal 110 and a terminal connected to one end of the power inductor L71 via the inductor connection terminal 115. With this connection configuration, the switch S71 can switch its ON/OFF state so as to selectively connect the input terminal 110 to one end of the power inductor L71 or disconnect the input terminal 110 from this end of the power inductor L71.

The switch S72 is an example of a twelfth switch and is connected between one end of the power inductor L71 and a ground. More specifically, the switch S72 has a terminal connected to one end of the power inductor L71 via the inductor connection terminal 115 and a terminal connected to a ground. With this connection configuration, the switch S72 can switch its ON/OFF state so as to selectively connect one end of the power inductor L71 to a ground or disconnect this end of the power inductor L71 from the ground.

The switch S61 is connected between the other end of the power inductor L71 and the output terminal 111. More specifically, the switch S61 has a terminal connected to the other end of the power inductor L71 and a terminal connected to the output terminal 111. With this connection configuration, the switch S61 can switch its ON/OFF state so as to selectively connect the other end of the power inductor L71 to the output terminal 111 or disconnect the other end of the power inductor L71 from the output terminal 111.

The switch S62 is connected between the other end of the power inductor L71 and the output terminal 112. More specifically, the switch S62 has a terminal connected to the other end of the power inductor L71 and a terminal connected to the output terminal 112. With this connection configuration, the switch S62 can switch its ON/OFF state so as to selectively connect the other end of the power inductor L71 to the output terminal 112 or disconnect the other end of the power inductor L71 from the output terminal 112.

The switch S63 is connected between the other end of the power inductor L71 and the output terminal 113. More specifically, the switch S63 has a terminal connected to the other end of the power inductor L71 and a terminal connected to the output terminal 113. With this connection configuration, the switch S63 can switch its ON/OFF state so as to selectively connect the other end of the power inductor L71 to the output terminal 113 or disconnect the other end of the power inductor L71 from the output terminal 113.

The capacitor C61 is connected between the output terminals 111 and 112. One of two electrodes of the capacitor C61 is connected to the switch S61 and the output terminal 111. The other one of the two electrodes of the capacitor C61 is connected to the switch S62, the output terminal 112, and one of two electrodes of the capacitor C62.

The capacitor C62 is connected between the output terminals 112 and 113. One of the two electrodes of the capacitor C62 is connected to the switch S62, the output terminal 112, and the other one of the two electrodes of the capacitor C61. The other one of the two electrodes of the capacitor C62 is connected to a path connecting the switch S63, the output terminal 113, and one of two electrodes of the capacitor C63.

The capacitor C63 is an example of a fourth capacitor and is connected between the output terminals 113 and 114. One of the two electrodes of the capacitor C63 is connected to the switch S63, the output terminal 113, and the other one of the two electrodes of the capacitor C62. The other one of the two electrodes of the capacitor C63 is connected to the output terminal 114 and one of two electrodes of the capacitor C64.

The capacitor C64 is connected between the output terminal 114 and a ground. One of the two electrodes of the capacitor C64 is connected to the output terminal 114 and the other one of the two electrodes of the capacitor C63. The other one of the two electrodes of the capacitor C64 is connected to a ground.

The switches S61 through S63 are controlled to be ON mutually exclusively. That is, only one of the switches S61 through S63 is turned ON, while the remaining switches are turned OFF. Turning ON only one of the switches S61 through S63 enables the pre-regulator circuit 10 to switch the voltage to be supplied to the switched-capacitor circuit 20 between the voltage levels of the voltages V2 through V4.

The pre-regulator circuit 10 configured as described above is configured to supply electric charge to the switched-capacitor circuit 20 via at least one of the output terminals 111 through 113.

According to an exemplary aspect, when the pre-regulator circuit 10 is configured to convert the input voltage (third voltage) into only one first voltage, the pre-regulator circuit 10 may include at least the switches S71 and S72 and the power inductor L71.

[1.2.4 Circuit Configuration of Filter Circuit 40]

The circuit configuration of the filter circuit 40 will now be described below. As illustrated in FIG. 2, the filter circuit 40 includes inductors L51, L52, and L53, capacitors C51 and C52, a resistor R51, an input terminal 140, and an output terminal 141.

The input terminal 140 is an input terminal for the second voltage selected by the output switch circuit 30. That is, the input terminal 140 is a terminal for receiving the second voltage selected from among the voltages V1 through V4.

The output terminal 141 is an output terminal for the power supply voltage $V_{ET}$. That is, the output terminal 141 is a terminal for supplying the power supply voltage $V_{ET}$ to the power amplifier circuit 2.

The inductors L51 and L52 are connected in series with each other between the input terminal 140 and the output terminal 141. A series connection circuit of the inductor L53 and the resistor R51 is connected in parallel with the inductor L51. The capacitor C51 is connected between a ground and a node between the inductors L51 and L52. The capacitor C52 is connected between the output terminal 141 and a ground.

With the above-described configuration, the filter circuit 40 forms a LC low pass filter in which inductors are disposed on a series arm path and a capacitor is disposed on a parallel arm path. This enables the filter circuit 40 to reduce radio frequency components included in a power supply voltage. For example, if the predetermined band is a frequency band for frequency division duplex (FDD), the filter circuit 40 is can be configured to reduce components of the downlink operating band of the predetermined band.

The configuration of the filter circuit 40 shown in FIG. 2 is an example and the filter circuit 40 is not limited thereto. The filter circuit 40 may form a band pass filter or a high pass filter in accordance with the band to be eliminated.

The filter circuit 40 may include two or more LC filters. In this case, the two or more LC filters are connected to the same output terminal 130 and have individual pass bands or attenuation bands corresponding to different bands. Alternatively, a first filter group formed by two or more LC filters may be connected to a first output terminal of the output switch circuit 30, while a second filter group formed by another two or more LC filters may be connected to a second output terminal of the output switch circuit 30. Each LC filter may have a pass band or an attenuation band of a corresponding one of the different bands. In this case, the filter circuit 40 may include two or more output terminals and may simultaneously output two or more power supply voltages $V_{ET}$ to the power amplifier circuit 2.

2 Explanation of Digital ET Mode

The digital ET mode and the analog ET mode will be explained below with reference to FIGS. 3A and 3B.

Figure 3A:
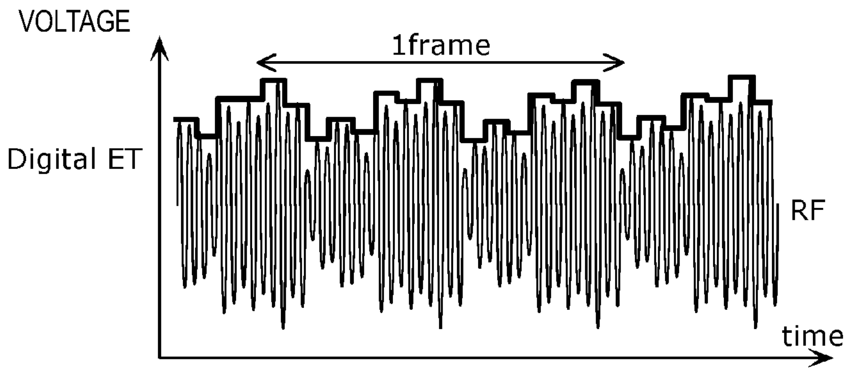
FIG. 3A is a graph illustrating an example of the transition of a power supply voltage in a digital ET mode.

FIG. 3A is a graph illustrating an example of the transition of a power supply voltage in the digital ET mode. FIG. 3B is a graph illustrating an example of the transition of a power supply voltage in the analog ET mode. In FIGS. 3A and 3B, the horizontal axis indicates the time, and the vertical axis indicates the voltage. The thick solid line represents the power supply voltage $V_{ET}$, while the thin solid line (waveform) represents a modulated signal.

In the digital ET mode, as shown in FIG. 3A, the power supply voltage $V_{ET}$ is varied to multiple discrete voltage levels within one frame so as to track the envelope of the modulated signal. As a result, the power supply voltage signal forms a rectangular wave. In the digital ET mode, based on an envelope signal ($\sqrt{(i^2+Q^2)}$), the power supply voltage level is selected from among multiple discrete voltage levels.

Figure 3B:
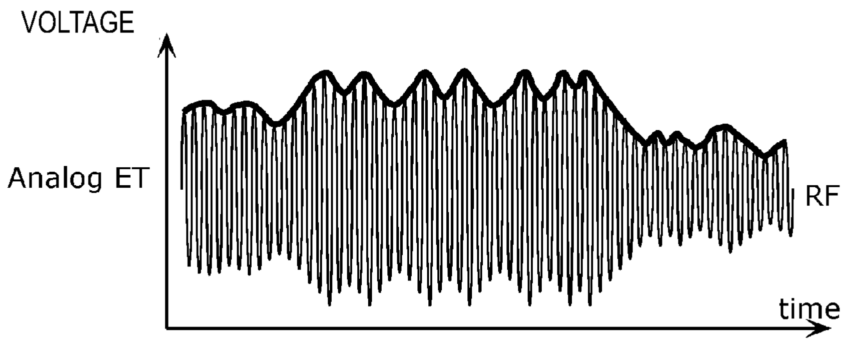
FIG. 3B is a graph illustrating an example of the transition of a power supply voltage in an analog ET mode.

In the analog ET mode, as shown in FIG. 3B, the power supply voltage $V_{ET}$ is continuously varied so as to track the envelope of the modulated signal. In the analog ET mode, the power supply voltage $V_{ET}$ is determined based on an envelope signal. In the analog ET mode, when the channel bandwidth is relatively small (lower than 60 MHz, for example), the power supply voltage $V_{ET}$ can follow a change in the envelope of a modulated signal, but when the channel bandwidth is relatively large (60 MHz or higher, for example), the power supply voltage $V_{ET}$ is unable to follow a change in the envelope of a modulated signal. In other words, when the channel bandwidth is relatively large, the amplitude change of the power supply voltage $V_{ET}$ tends to delay with respect to a change in the envelope of a modulated signal.

In contrast, when the channel bandwidth is relatively large (60 MHz or higher, for example), with the application of the digital ET mode, the followability of the power supply voltage V to the modulated signal is improved, as shown in FIG. 3A.

In an exemplary aspect, when a tracker module is formed by mounting the individual switches of the switch output circuit 30 on a module laminate as a one-chip switch integrated circuit, the following issue arises. Since the output switch circuit 30 includes a DCL line for transferring a DCL signal, digital noise generated from the DCL line may become a noise source for peripheral circuits. Although the DCL signal is a control signal based on the envelope, the operating frequency of the DCL signal is not fixed because it is varied in accordance with the channel bandwidth. For this reason, compared with other control lines, high-performance shielding configurations are required for the DCL line to reduce a leakage of digital noise in a wide band.

Regarding a tracker module on which the output switch circuit 30 is mounted, the configuration of the tracker module that can reduce the occurrence of digital noise will be discussed below.

3 Component Arrangement of Tracker Module

As examples of the power supply circuit 1 configured as described above, a tracker module having the pre-regulator circuit 10 (except for the power inductor L71), switched-capacitor circuit 20, output switch circuit 30, and filter circuit 40 mounted thereon will be explained below with reference to FIGS. 4 through 15. The power inductor L71 of the pre-regulator circuit 10 is not included in the tracker module of the following examples.

[3.1 Configuration of Component Arrangement of Tracker Module 100A According to First Exemplary Aspect]

Figure 4:
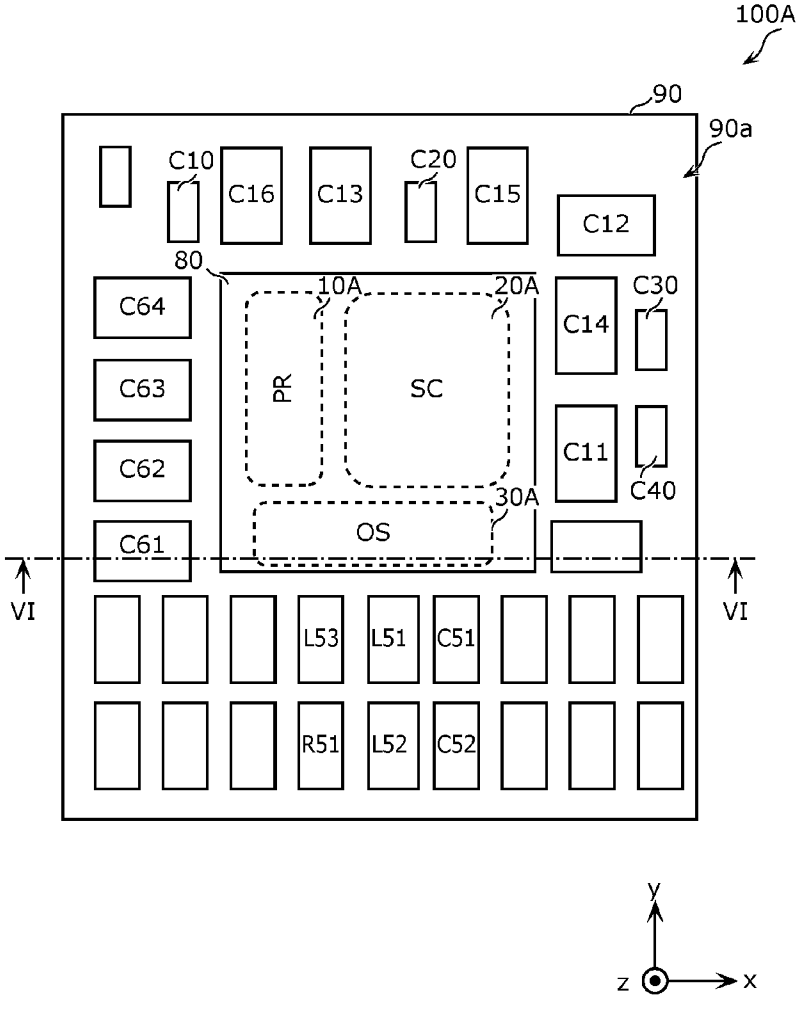
FIG. 4 is a first plan view of a tracker module according to a first exemplary aspect.
Figure 5:
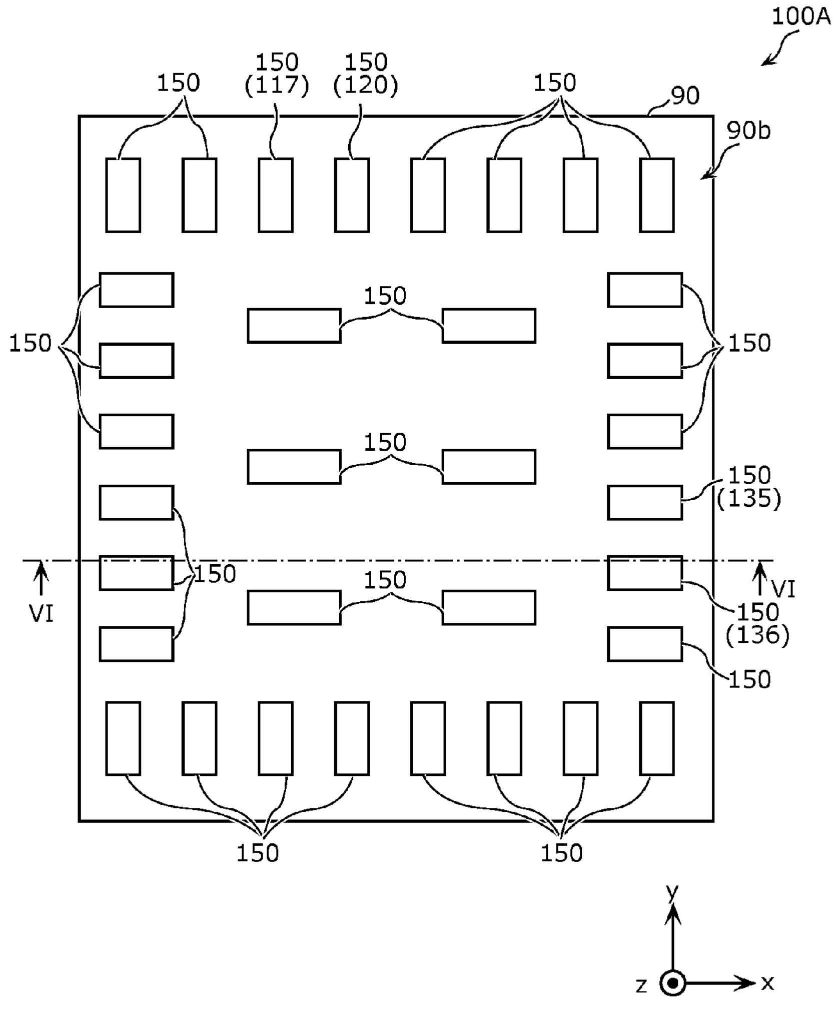
FIG. 5 is a second plan view of the tracker module according to the first exemplary aspect.
Figure 6:
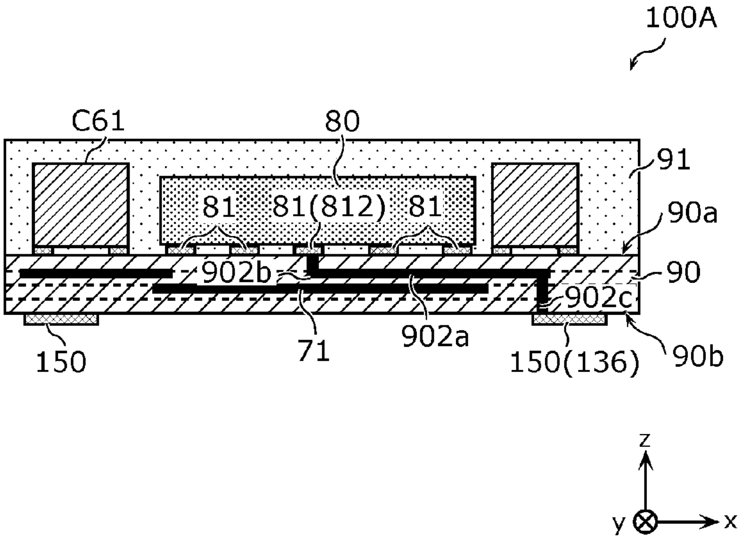
FIG. 6 is a sectional view of the tracker module according to the first exemplary aspect.
Figure 7:
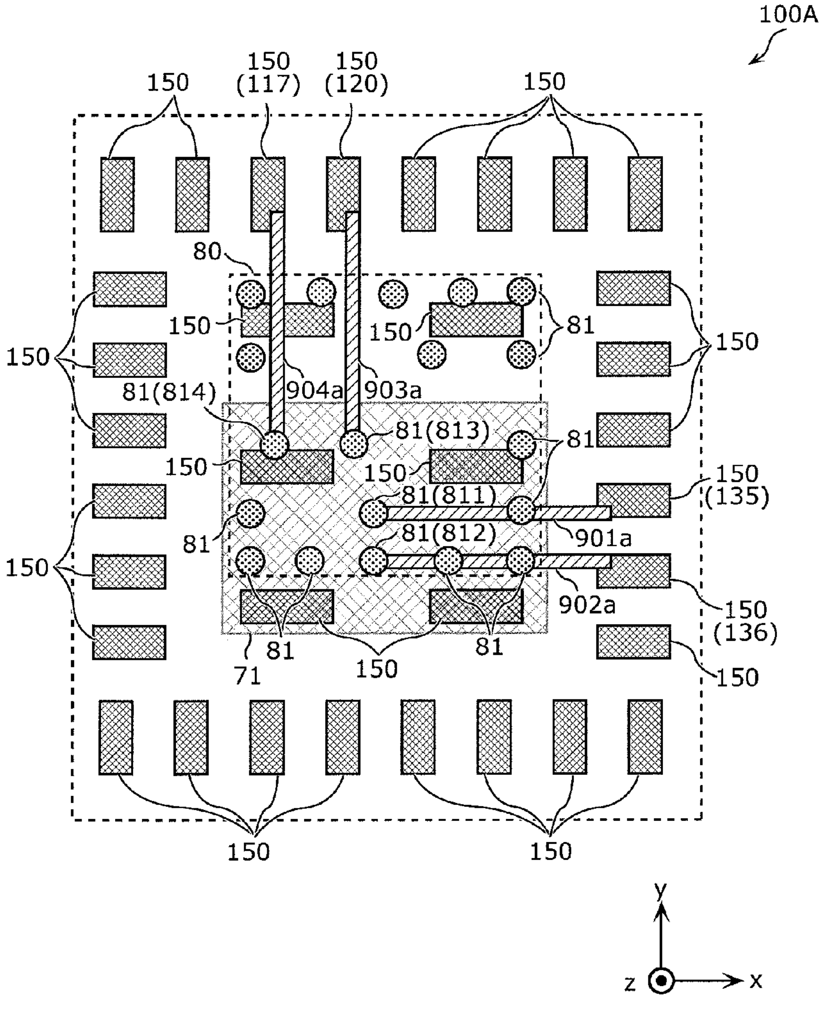
FIG. 7 is a plan view of plural electrodes and plural lines included in the tracker module according to the first exemplary aspect.

FIG. 4 is a first plan view of a tracker module 100A according to a first exemplary aspect. FIG. 5 is a second plan view of the tracker module 100A according to the first exemplary aspect. FIG. 6 is a sectional view of the tracker module 100A of the first exemplary aspect taken along line VI-VI in FIGS. 4 and 5. FIG. 7 is a plan view of plural electrodes and plural lines included in the tracker module 100A according to the first exemplary aspect.

FIG. 4 shows the layout of circuit components mounted on a module laminate 90 having main surfaces 90*a* and 90*b* facing each other when the main surface 90*a* is seen from the positive side of the z axis. FIG. 5 shows the layout of circuit components mounted on the module laminate 90 when the main surface 90*b* is seen through from the positive side of the z axis. In FIG. 7, some of the electrodes and lines when the tracker module 100A is seen through from the positive side of the z axis are shown.

The tracker module 100A according to the first exemplary aspect corresponds to a specific configuration of the arrangement of some of the circuit components of the power supply circuit 1 of the embodiment.

As illustrated in FIGS. 4 through 7, the tracker module 100A of the first exemplary aspect includes the module laminate 90, an integrated circuit 80, capacitors C10, C20, C30, C40, C11, C12, C13, C14, C15, C16, C51, C52, C61, C62, C63, and C64, inductors L51, L52, and L53, resistor R51, and resin member 91.

The module laminate 90 has main surfaces 90*a* and 90*b* facing each other. The module laminate 90 also includes wiring units 901, 902, 903, and 904 and a ground electrode 71. The module laminate 90 has a rectangular shape in a plan view of FIGS. 6 and 7, but it is not limited to this shape.

As the module laminate 90, a low temperature co-fired ceramics (LTCC) substrate or a high temperature co-fired ceramics (HTCC) substrate having a multilayer structure formed by plural dielectric layers, a component-embedded board, a substrate having a redistribution layer (RDL), or a printed circuit board, for example, may be used. However, the module laminate 90 is not limited to these types of substrates.

On the main surface 90*a*, the integrated circuit 80, capacitors C10 through C40, C11 through C16, C51, C52, and C61 through C64, inductors L51 through L53, resistor R51, and resin member 91 are disposed.

The integrated circuit 80 includes a PR switch unit 10A, an SC switch unit 20A, an OS switch unit 30A, and plural bump electrodes 81. The PR switch unit 10A includes the switches S61 through S63, S71, and S72. The SC switch unit 20A includes the switches S11 through S14, S21 through S24, S31 through S34, and S41 through S44. The OS switch unit 30A includes the switches S51 through S54.

The capacitors C10, C20, C30, C40, C11, C12, C13, C14, C15, and C16 are capacitors included in the switched-capacitor circuit 20. The capacitors C51 and C52 are capacitors included in the filter circuit 40. The capacitors C61, C62, C63, and C64 are capacitors included in the pre-regulator circuit 10.

In FIG. 4, the PR switch unit 10A, SC switch unit 20A, and OS switch unit 30A are included in the single integrated circuit 80. However, this is only an example. In one example, the PR switch unit 10A and the SC switch unit 20A may be included in one integrated circuit, and the OS switch unit 30A may be included in another integrated circuit. In another example, the SC switch unit 20A and the OS switch unit 30A may be included in one integrated circuit, and the PR switch unit 10A may be included in another integrated circuit. In another example, the PR switch unit 10A and the OS switch unit 30A may be included in one integrated circuit, and the SC switch unit 20A may be included in another integrated circuit. Alternatively, the PR switch unit 10A, SC switch unit 20A, and OS switch unit 30A may be individually included in three integrated circuits. Alternatively, among the PR switch unit 10A, SC switch unit 20A, and OS switch unit 30A, the integrated circuit 80 may include only the OS switch unit 30A, and the PR switch unit 10A and the SC switch unit 20A may be disposed outside the module laminate 90.

The integrated circuit 80 is a semiconductor IC (Integrated Circuit) and is formed by a CMOS (Complementary Metal Oxide Semiconductor), for example, and more specifically, the integrated circuit 80 is manufactured by a SOI (Silicon on Insulator) process. The integrated circuit 80 may be made of at least one of GaAs, SiGe, and GaN. The semiconductor material for the integrated circuit 80 is not limited to the above-described materials.

The plural bump electrodes 81 are electrically connected to, for example, plural electronic components disposed on the main surface 90*a* or to plural land electrodes 150 disposed on the main surface 90*b* via wiring layers or via-conductors, for example, formed in the module laminate 90. The plural bump electrodes 81 include bump electrodes 811, 812, 813, and 814.

The bump electrode 811 is an example of a first IC terminal and is connected to a switch of the OS switch unit 30A and to a land electrode 150 (an example of an external connection terminal) which serves as the control terminal 135. More specifically, the the bump electrode 811 is connected to the land electrode 150 via a via-conductor 901*b* (not shown) formed inside the module laminate 90 on the side of the main surface 90*a*, a line 901*a* (an example of a first line) formed on a wiring layer inside the module laminate 90, and a via-conductor 901*c* (not shown) formed inside the module laminate 90 on the side of the main surface 90*b*.

The bump electrode 812 is an example of a second IC terminal and is connected to a switch of the OS switch unit 30A and to a land electrode 150 (an example of an external connection terminal) which serves as the control terminal 136. More specifically, as shown in FIG. 6, the bump electrode 812 is connected to the land electrode 150 via a via-conductor 902*b* formed inside the module laminate 90 on the side of the main surface 90*a*, a line 902*a* (an example of a second line) formed on a wiring layer inside the module laminate 90, and a via-conductor 902*c* formed inside the module laminate 90 on the side of the main surface 90*b*.

The line 901*a* and the via-conductors 901*b* and 901*c* form a wiring unit 901, while the line 902*a* and the via-conductors 902*b* and 902*c* form a wiring unit 902. Each of the wiring units 901 and 902 is an example of a first control line through which a DCL signal (first digital control signal including a digital control line/logic signal) indicating one of the voltages V1 through V4 flows.

The bump electrode 813 is connected to a switch of the SC switch unit 20A and to a land electrode 150 (an example of an external connection terminal) which serves as the control terminal 120. More specifically, the bump electrode 813 is connected to the land electrode 150 via a via-conductor 903*b* (not shown) formed inside the module laminate 90 on the side of the main surface 90*a*, a line 903*a* (an example of a second control line) formed on a wiring layer inside the module laminate 90, and a via-conductor 903*c* (not shown) formed inside the module laminate 90 on the side of the main surface 90*b*.

The bump electrode 814 is connected to a switch of the PR switch unit 10A and to a land electrode 150 (an example of an external connection terminal) which serves as the control terminal 117. More specifically, the bump electrode 814 is connected to the land electrode 150 via a via-conductor 904*b* (not shown) formed inside the module laminate 90 on the side of the main surface 90*a*, a line 904*a* (an example of a second control line) formed on a wiring layer inside the module laminate 90, and a via-conductor 904*c* (not shown) formed inside the module laminate 90 on the side of the main surface 90*b*.

The line 903*a* and the via-conductors 903*b* and 903*c* form a wiring unit 903, while the line 904*a* and the via-conductors 904*b* and 904*c* form a wiring unit 904. Each of the wiring units 903 and 904 is an example of a second control line through which the second digital control signal based on the source synchronous system flows.

The bump electrodes 81, 811, 812, 813, and 814 may be planar electrodes.

The ground electrode 71 is an example of a metal member which is set to a ground potential. The ground electrode 71 is a planar electrode extending in a direction parallel with the main surfaces 90*a* and 90*b* and is set to, for example, a ground potential of an external circuit disposed in the tracker module 100A on the side of the main surface 90*b*. The ground electrode 71 is formed inside the module laminate 90. More specifically, the ground electrode 71 is connected to a ground terminal.

As the metal member which is set to a ground potential, the use of a planar electrode (ground plane) extending in a direction parallel with the main surfaces 90*a* and 90*b* can more effectively block noise from the circuit components and lines positioned in the top-down direction (z-axis direction) of the planar electrode.

The resin member 91 is disposed on the main surface 90*a* and covers the main surface 90*a* and some of the circuit components forming the tracker module 100A. The resin member 91 has the function of securing the reliability, such as the mechanical strength and the moisture resistance, of the circuit components forming the tracker module 100A.

The tracker module 100A may include only the integrated circuit 80 and the module laminate 90. The integrated circuit 80 may include only the OS switch unit 30A. The OS switch unit 30A may include at least one of the above-described switches S51 through S54.

The integrated circuit 80 may include only the OS switch unit 30A, while one or more additional integrated circuits different from the integrated circuit 80 may include the PR switch unit 10A and/or the SC switch unit 20A. In this case, only the integrated circuit 80 may be disposed on the module laminate 90, or the integrated circuit 80 and the above-described additional integrated circuit/circuits may be disposed on the module laminate 90.

Each of the capacitors C10 through C40, C11 through C16, C51, C52, and C61 through C64 is mounted as a chip capacitor. The chip capacitor is a surface mount device (SMD) forming a capacitor. However, the capacitors may be mounted as a device other than a chip capacitor. For example, the capacitors may be included in an integrated passive device (IPD).

Each of the inductors L51 through L53 is mounted as a chip inductor. The chip inductor is an SMD forming an inductor. However, the inductors may be mounted as a device other than a chip inductor. For example, the inductors may be included in an IPD.

The resistor R51 is mounted as a chip resistor. The chip resistor is an SMD forming a resistor. However, the resistor R51 may be mounted as a device other than a chip resistor. For example, the resistor R51 may be included in an IPD.

The plural capacitors, plural inductors, and resistor disposed on the main surface 90*a* in this manner are formed into groups according to each circuit and are disposed around the integrated circuit 80. This will be discussed more specifically. In a plan view of the module laminate 90, a group of the capacitors C61 through C64 included in the pre-regulator circuit 10 is disposed on the main surface 90*a* in a region sandwiched between a straight line along the left side of the integrated circuit 80 and a straight line along the left side of the module laminate 90. In a plan view of the module laminate 90, a group of the capacitors C10 through C40 included in the switched-capacitor circuit 20 is disposed on the main surface 90*a* in a region sandwiched between a straight line along the top side of the integrated circuit 80 and a straight line along the top side of the module laminate 90 and in a region sandwiched between a straight line along the right side of the integrated circuit 80 and a straight line along the right side of the module laminate 90. In a plan view of the module laminate 90, a group of the capacitors C51 and C52, inductors L51 through L53, and resistor R51 included in the filter circuit 40 is disposed on the main surface 90*a* in a region sandwiched between a straight line along the bottom side of the integrated circuit 80 and a straight line along the bottom side of the module laminate 90.

Some of the capacitors and inductors disposed on the main surface 90*a* may be formed inside the module laminate 90. Some of the capacitors and inductors disposed on the main surface 90*a* may be provided outside the tracker module 100A, in which case, they may be disposed outside the module laminate 90.

The land electrodes 150 serve as plural external connection terminals including ground terminals as well as the input terminal 110, output terminal 141, inductor connection terminals 115 and 116, and control terminals 117, 120, 135, and 136 shown in FIG. 2. The land electrodes 150 are electrically connected to plural electronic components disposed on the main surface 90*a* via, for example, via-conductors formed inside the module laminate 90. As the land electrodes 150, copper electrodes may be used. However, the land electrodes 150 are not limited to copper electrodes. For example, solder electrodes may be used as the land electrodes. Instead of the land electrodes 150, plural bump electrodes or plural post electrodes may be used as plural external connection terminals.

In the tracker module 100A according to the first example, at least part of the line 901*a* and at least part of the line 902*a* are disposed between the integrated circuit 80 and the ground electrode 71 in a sectional view of the module laminate 90 and match the ground electrode 71 in a plan view of the module laminate 90.

According to an exemplary aspect, when the individual switches of the output switch circuit 30 are mounted on the module laminate 90 as the integrated circuit 80, the following issue arises. The output switch circuit 30 includes the wiring units 901 and 902 for transferring DCL signals. In this case, digital noise generated from the wiring units 901 and 902 may become a noise source for peripheral circuits. Although the DCL signal is a control signal based on the envelope, the operating frequency of the DCL signal is not fixed because it is varied in accordance with the channel bandwidth. For this reason, compared with other control lines, high-performance shielding configurations are required for the wiring units 901 and 902 to reduce a leakage of digital noise in a wide band.

To address this issue, with the above-described configuration, since at least part of the wiring unit 901 and at least part of the wiring unit 902 are disposed between the integrated circuit 80 and the ground electrode 71, it is less likely to cause a leakage of digital noise from the wiring units 901 and 902 to the peripheral circuits. The tracker module 100A can thus be configured to reduce the occurrence of noise.

In the tracker module 100A according to the first example, in a plan view of the module laminate 90, the bump electrode 811 matches part of the ground electrode 71 and the bump electrode 812 also matches part of the ground electrode 71. It is noted that according to an exemplary aspect, the term "matches" as used in this disclosure refers the respective components overlapping in the plan view of the module laminate 90 (e.g., in the vertical or thickness direction).

With this configuration, since the bump electrodes 811 and 812 for transferring DCL signals match part of the ground electrode 71 in a plan view of the module laminate 90, it is less likely to cause a leakage of digital noise from the bump electrodes 811 and 812 to the peripheral circuits.

In the tracker module 100A according to the first exemplary aspect, in a plan view of the module laminate 90, the individual switches included in the OS switch unit 30A match part of the ground electrode 71.

With this configuration, since each of the switches for receiving a DCL signal matches part of the ground electrode 71 in a plan view of the module laminate 90, it is less likely to cause a leakage of digital noise generated from a node between each of the switches and the corresponding one of the wiring units 901 and 902 to the peripheral circuits.

In the tracker module 100A according to the first exemplary aspect, the ground electrode 71 is disposed between the integrated circuit 80 and land electrodes 150 in a sectional view of the module laminate 90, and the land electrodes 150 match part of the ground electrode 71 in a plan view of the module laminate 90. At least one of the land electrodes 150 matching part of the ground electrode 71 in a plan view of the module laminate 90 is not an electrode set to a ground potential, but an electrode (hot electrode) for transferring a control signal or a voltage signal corresponding to the power supply voltage $V_{ET}$.

With this configuration, in a plan view of the module laminate 90, a land electrode 150, which is an I/O terminal with an external circuit, matches part of the ground electrode 71. It is thus less likely to cause a leakage of digital noise from the wiring units 901 and 902 to the external circuits.

In the tracker module 100A according to the first exemplary aspect, at least part of the line 903*a* and at least part of the line 904*a* are disposed between the integrated circuit 80 and the ground electrode 71 in a sectional view of the module laminate 90 and match the ground electrode 71 in a plan view of the module laminate 90.

With this configuration, since at least part of the line 903*a* and at least part of the line 904*a* are disposed between the integrated circuit 80 and the ground electrode 71, it is less likely to cause a leakage of digital noise generated from the lines 903*a* and 904*a* for transferring control signals, which are not DCL signals, to the peripheral circuits. Thus, the tracker module 100A can be implemented to reduce the occurrence of noise.

In the tracker module 100A according to the first exemplary aspect, the integrated circuit 80 and the capacitor C11 are adjacent to each other, the integrated circuit 80 and the capacitor C13 are adjacent to each other, the integrated circuit 80 and the capacitor C14 are adjacent to each other, the integrated circuit 80 and the capacitor C15 are adjacent to each other, and the integrated circuit 80 and the capacitor C16 are adjacent to each other.

In the first exemplary aspect, the phrase "the integrated circuit 80 and the capacitor C11 are adjacent to each other" means that the integrated circuit 80 and the capacitor C11 are disposed close to each other, and more specifically, no circuit component is located in a space sandwiched between a side surface of the integrated circuit 80 and a side surface of the capacitor C11 facing each other. The circuit components include active components, such as transistors and diodes, and passive components, such as inductors, transformers, capacitors, and resistors, and do not include terminals, connectors, electrodes, wiring, and resin members.

In the switched-capacitor circuit 20, as a result of the capacitors repeatedly performing charging and discharging at high speed, highly accurate and stable multiple second voltages can be supplied to the output switch circuit 30. To achieve this operation, the lines connecting the capacitors and switches to be connected to these capacitors can transfer electric charge at high speed and at low resistance.

To address this issue, since the integrated circuit 80 and capacitors of the switched-capacitor circuit 20 are adjacent to each other, the length of the lines connecting the capacitors and the switches of the SC switch unit 20A can be made it short, thereby lowering parasitic resistance and parasitic inductance in these lines in the switched-capacitor circuit 20. Hence, highly accurate and stable multiple second voltages can be supplied from the switched-capacitor circuit 20 to the output switch circuit 30. This configuration makes it less likely to degrade the output waveform of the power supply voltage $V_{ET}$ output from the tracker module 100A.

Each of the capacitors C61, C62, C63, and C64 is adjacent to the integrated circuit 80.

With this configuration, since the integrated circuit 80 and the capacitors of the pre-regulator circuit 10 are adjacent to each other, the lines connecting the capacitors and the switches of the PR switch unit 10A can be made it short, thereby lowering parasitic resistance and parasitic inductance in these lines in the pre-regulator circuit 10. It is thus possible to reduce the occurrence of ringing, which would be caused by the parasitic inductance, during the switching operation of the switches of the PR switch unit 10A.

In the first exemplary aspect, the integrated circuit 80 and each of the inductors L51 and L53 and the capacitor C51 are adjacent to each other.

With this configuration, since the integrated circuit 80 and circuit components of the filter circuit 40 are adjacent to each other, the lines connecting these circuit components and the switches of the OS switch unit 30A can be made it short, thereby lowering parasitic resistance and parasitic inductance in the lines connecting the filter circuit 40 and the output switch circuit 30. Hence, highly accurate and stable power supply voltage $V_{ET}$ can be supplied from the filter circuit 40.

With this configuration, the OS switch unit 30A of the integrated circuit 80 and each of the inductors L51 and L53 and the capacitor C51 are adjacent to each other.

With this configuration, the lines connecting the inductors L51 and L53 and the capacitor C51 and the switches of the OS switch unit 30A can be made it even shorter, thereby further lowering parasitic resistance and parasitic inductance in the lines connecting the filter circuit 40 and the output switch circuit 30. It is thus possible to suppress the degradation of the bandpass characteristics and attenuation characteristics of the filter circuit 40, which would be caused by a decrease in the Q factor of the inductance of the lines due to the parasitic resistance.

[3.2 Configuration of Component Arrangement of Tracker Module 100B According to Second Exemplary Aspect]

Figure 8:
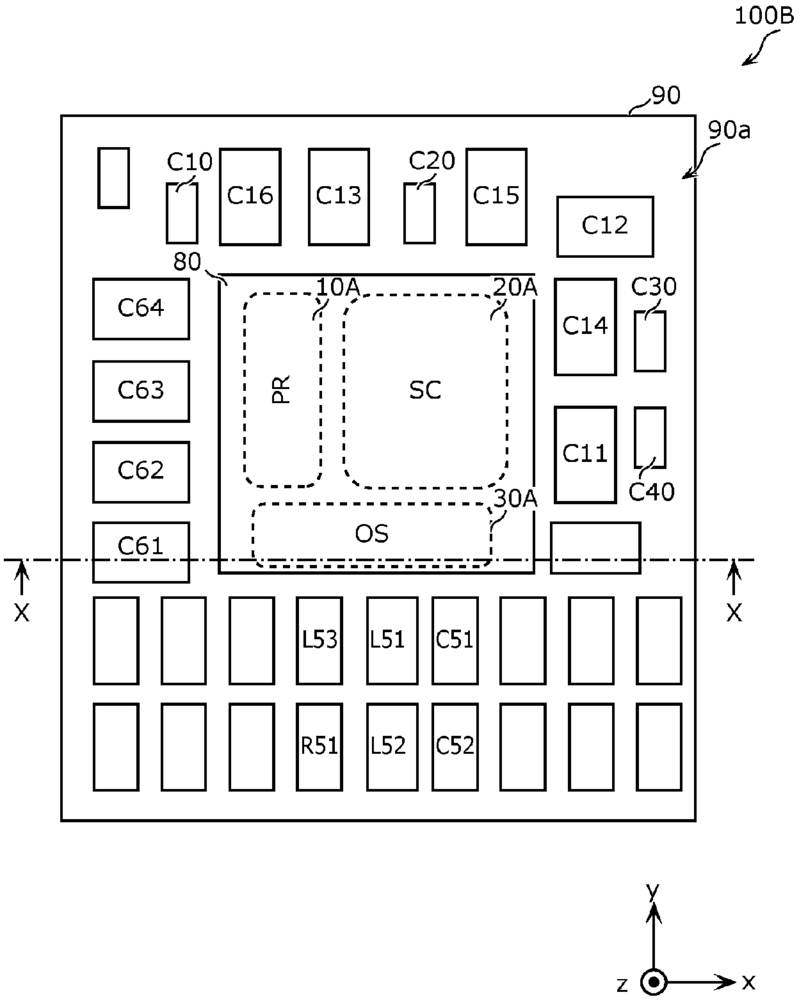
FIG. 8 is a first plan view of a tracker module according to a second exemplary aspect.
Figure 9:
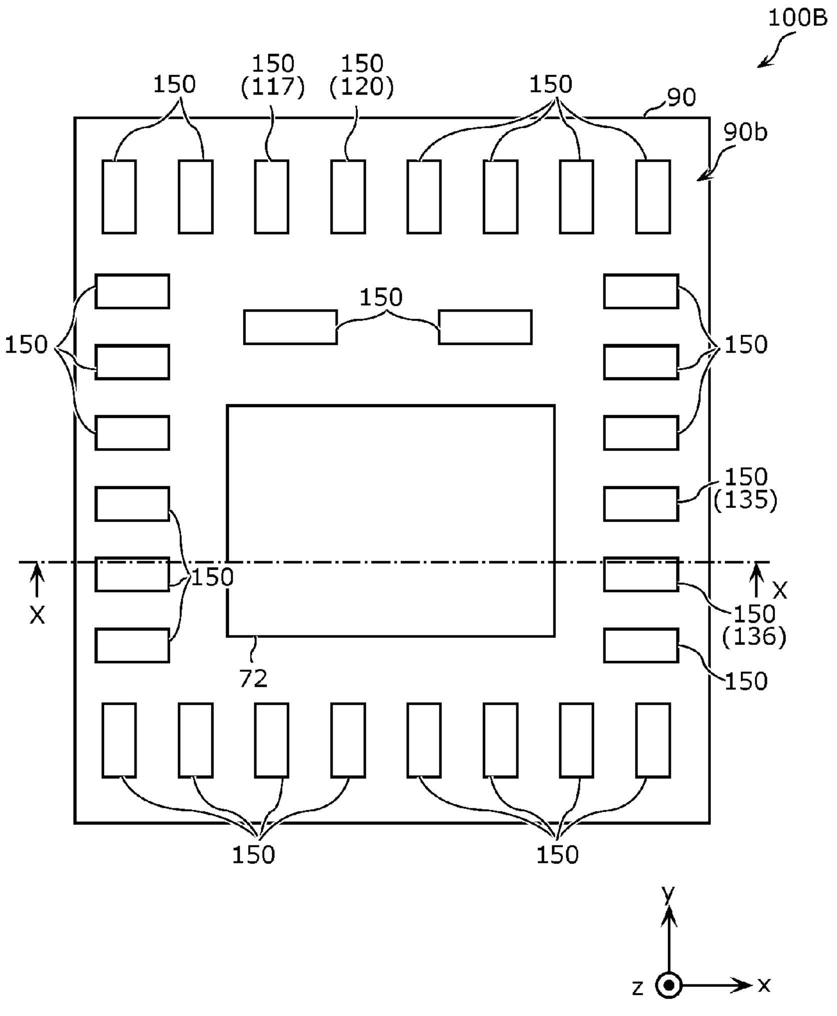
FIG. 9 is a second plan view of the tracker module according to the second exemplary aspect.
Figure 10:
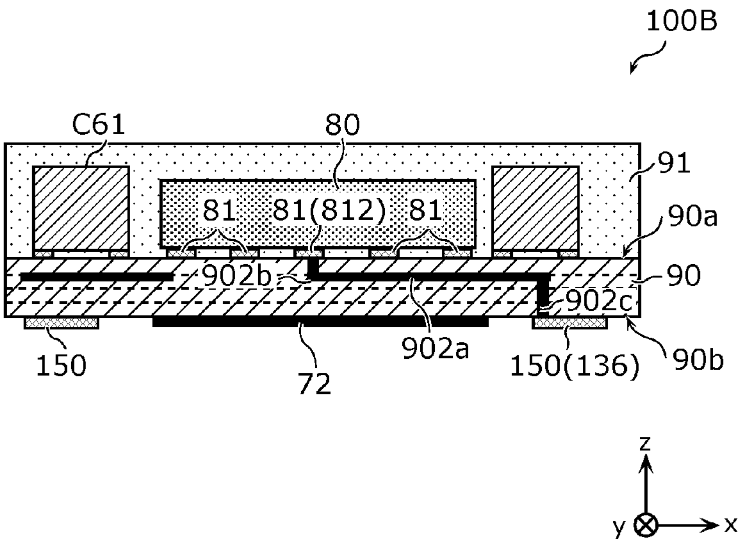
FIG. 10 is a sectional view of the tracker module according to the second exemplary aspect.
Figure 11:
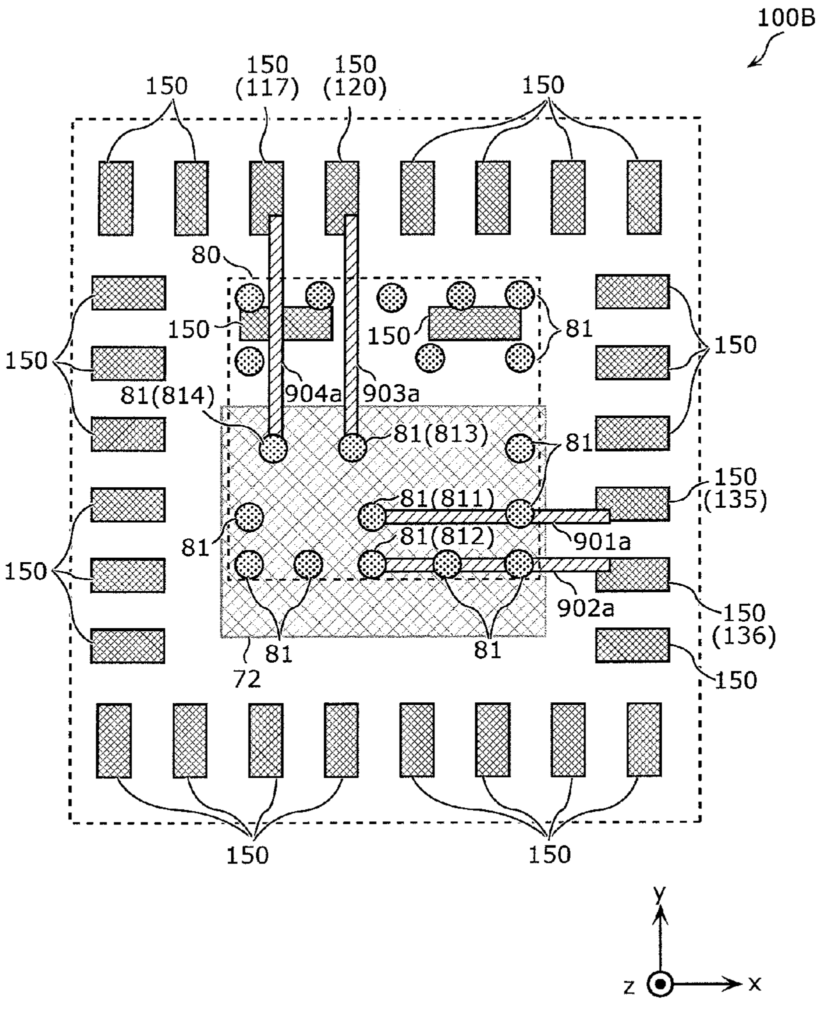
FIG. 11 is a plan view of plural electrodes and plural lines included in the tracker module according to the second exemplary aspect.

FIG. 8 is a first plan view of a tracker module 100B according to a second exemplary aspect. FIG. 9 is a second plan view of the tracker module 100B according to the second exemplary aspect. FIG. 10 is a sectional view of the tracker module 100B of the second exemplary aspect taken along line X-X in FIGS. 8 and 9. FIG. 11 is a plan view of plural electrodes and plural lines included in the tracker module 100B according to the second exemplary aspect.

FIG. 8 shows the layout of circuit components mounted on a module laminate 90 having main surfaces 90*a* and 90*b* facing each other when the main surface 90*a* is seen from the positive side of the z axis. FIG. 9 shows the layout of circuit components mounted on the module laminate 90 when the main surface 90*b* is seen through from the positive side of the z axis. In FIG. 11, some of the electrodes and lines when the tracker module 100B is seen through from the positive side of the z axis are shown.

The tracker module 100B according to the second exemplary aspect corresponds to a specific configuration of the arrangement of some of the circuit components of the power supply circuit 1 of the embodiment.

As illustrated in FIGS. 8 through 11, the tracker module 100B according to the second exemplary aspect includes a module laminate 90, an integrated circuit 80, capacitors C10, C20, C30, C40, C11, C12, C13, C14, C15, C16, C51, C52, C61, C62, C63, and C64, inductors L51, L52, and L53, resistor R51, and resin member 91. The tracker module 100B according to the second exemplary aspect is different from the tracker module 100A according to the first exemplary aspect in the configuration of the arrangement of a ground electrode 72. The tracker module 100B of the second exemplary aspect will be described below mainly by referring to the part of the configuration different from the tracker module 100A of the first exemplary aspect while omitting an explanation of the same part of configuration as the tracker module 100A.

The module laminate 90 has main surfaces 90*a* and 90*b* facing each other. The module laminate 90 also includes wiring units 901, 902, 903, and 904 and a ground electrode 72.

The ground electrode 72 is an example of a metal member which is set to a ground potential. The ground electrode 72 is a planar electrode extending in a direction parallel with the main surfaces 90*a* and 90*b* and is set to, for example, a ground potential of an external circuit disposed in the tracker module 100B on the side of the main surface 90*b*. The ground electrode 72 is formed on the main surface 90*b*. More specifically, the ground electrode 72 is connected to a ground terminal.

With this configuration, since the ground electrode 72 is exposed on the back surface of the tracker module 100B, the heat dissipation of the tracker module 100B is improved.

In the tracker module 100B according to the second example, at least part of the line 901*a* and at least part of the line 902*a* are disposed between the integrated circuit 80 and the ground electrode 72 in a sectional view of the module laminate 90 and match the ground electrode 72 in a plan view of the module laminate 90.

In the tracker module 100B according to the second exemplary aspect, in a plan view of the module laminate 90, the bump electrode 811 matches part of the ground electrode 72 and the bump electrode 812 also matches part of the ground electrode 72.

In the tracker module 100B according to the second exemplary aspect, in a plan view of the module laminate 90, the individual switches included in the OS switch unit 30A match part of the ground electrode 72.

In the tracker module 100B according to the second exemplary aspect, at least part of the line 903*a* and at least part of the line 904*a* are disposed between the integrated circuit 80 and the ground electrode 72 in a sectional view of the module laminate 90 and match the ground electrode 72 in a plan view of the module laminate 90.

[3.3 Configuration of Component Arrangement of Tracker Module 100C According to Third Exemplary Aspect]

Figure 12:
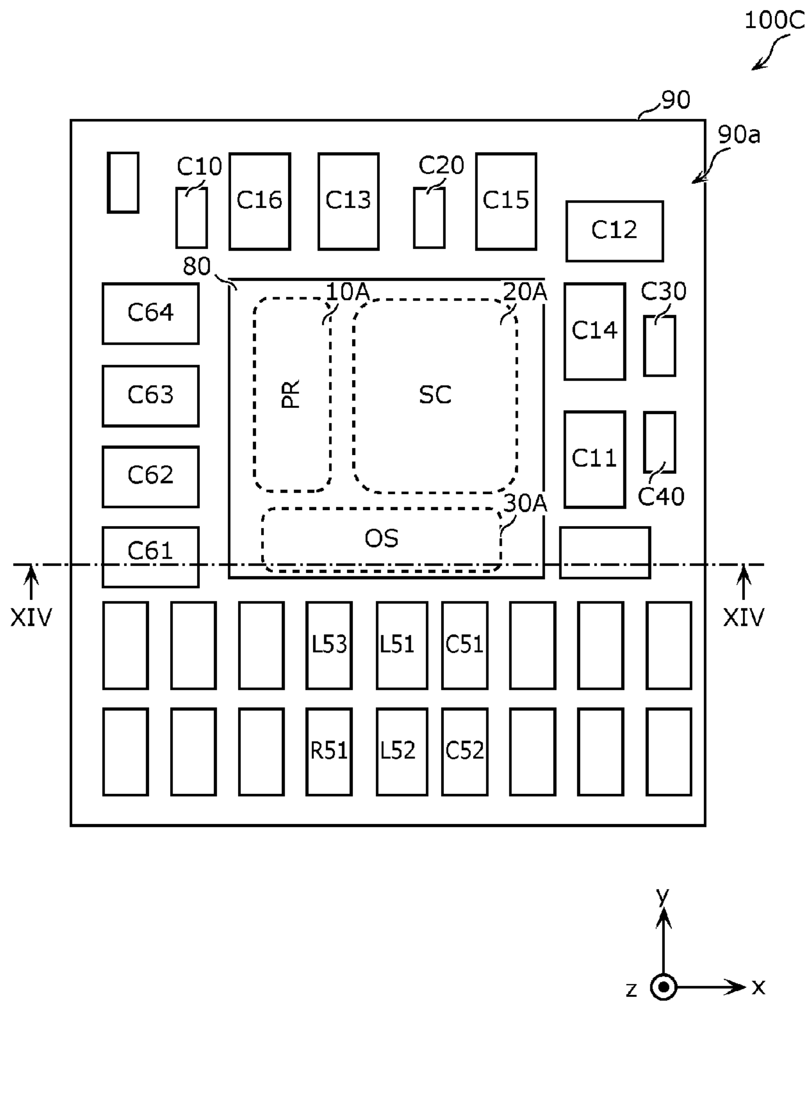
FIG. 12 is a first plan view of a tracker module according to a third exemplary aspect.
Figure 13:
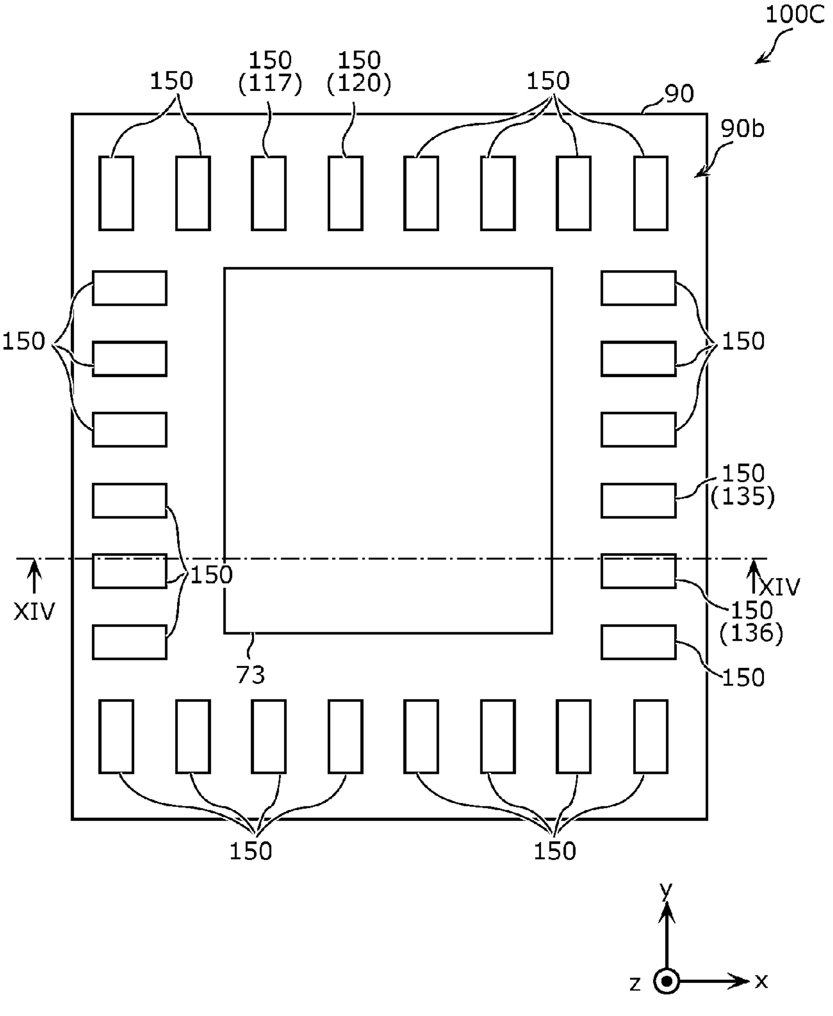
FIG. 13 is a second plan view of the tracker module according to the third exemplary aspect.
Figure 14:
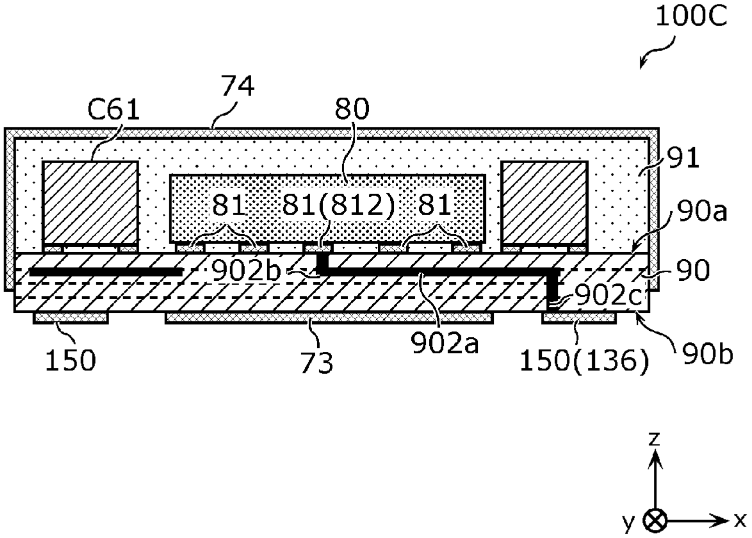
FIG. 14 is a sectional view of the tracker module according to the third exemplary aspect.
Figure 15:
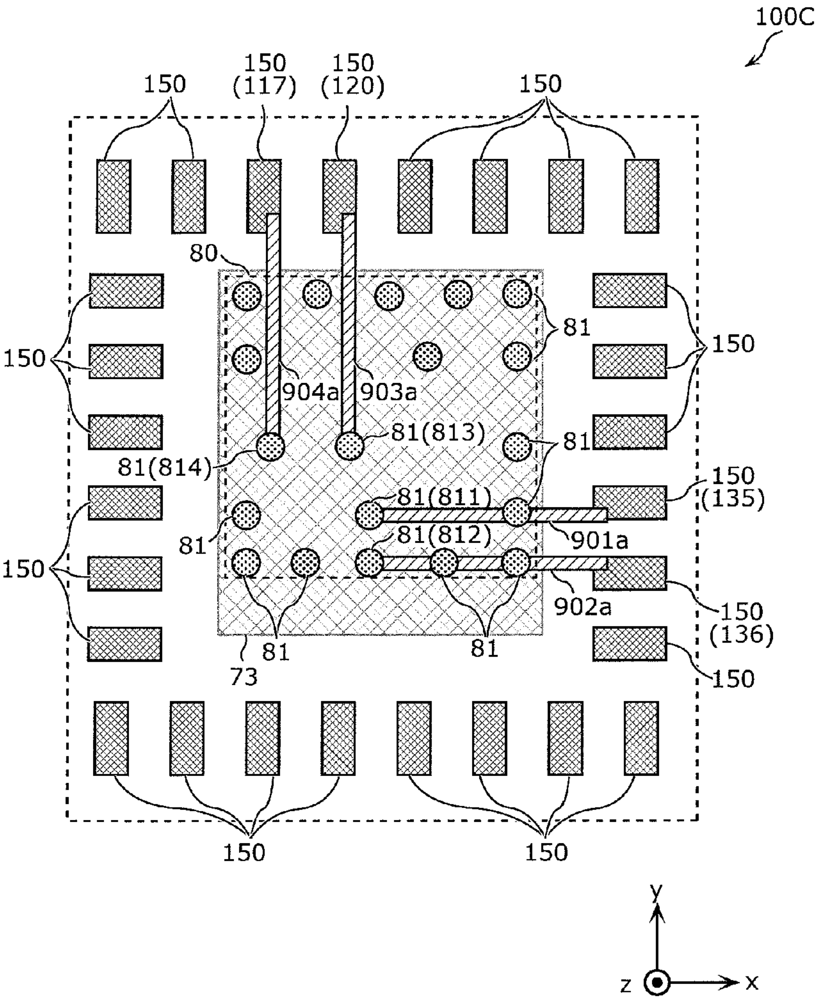
FIG. 15 is a plan view of plural electrodes and plural lines included in the tracker module according to the third exemplary aspect.

FIG. 12 is a first plan view of a tracker module 100C according to a third exemplary aspect. FIG. 13 is a second plan view of the tracker module 100C according to the third exemplary aspect. FIG. 14 is a sectional view of the tracker module 100C of the third exemplary aspect taken along line XIV-XIV in FIGS. 12 and 13. FIG. 15 is a plan view of plural electrodes and plural lines included in the tracker module 100C according to the third exemplary aspect.

FIG. 12 shows the layout of circuit components mounted on a module laminate 90 having main surfaces 90*a* and 90*b* facing each other when the main surface 90*a* is seen from the positive side of the z axis. FIG. 13 shows the layout of circuit components mounted on the module laminate 90 when the main surface 90*b* is seen through from the positive side of the z axis. In FIG. 15, some of the electrodes and lines when the tracker module 100C is seen through from the positive side of the z axis are shown.

The tracker module 100C according to the third exemplary aspect corresponds to a specific configuration of the arrangement of some of the circuit components of the power supply circuit 1 of the embodiment.

As illustrated in FIGS. 12 through 15, the tracker module 100C according to the third exemplary aspect includes a module laminate 90, an integrated circuit 80, capacitors C10, C20, C30, C40, C11, C12, C13, C14, C15, C16, C51, C52, C61, C62, C63, and C64, inductors L51, L52, and L53, resistor R51, resin member 91, and shield electrode 74. The tracker module 100C according to the third exemplary aspect is different from the tracker module 100A according to the first exemplary aspect in the configuration of the arrangement of a ground electrode 73 and the addition of the shield electrode 74. The tracker module 100C of the third exemplary aspect will be described below mainly by referring to the part of the configuration different from the tracker module 100A of the first exemplary aspect while omitting an explanation of the same part of the configuration as the tracker module 100A.

The module laminate 90 has main surfaces 90*a* and 90*b* facing each other. The module laminate 90 also includes wiring units 901, 902, 903, and 904 and a ground electrode 73.

The ground electrode 73 is an example of a metal member which is set to a ground potential. The ground electrode 73 is a planar electrode extending in a direction parallel with the main surfaces 90*a* and 90*b* and is set to, for example, a ground potential of an external circuit disposed in the tracker module 100C on the side of the main surface 90*b*. The ground electrode 73 is formed on the main surface 90*b*. More specifically, the ground electrode 73 is connected to a ground terminal.

With this configuration, since the ground electrode 73 is exposed on the back surface of the tracker module 100C, the heat dissipation of the tracker module 100C is improved.

The shield electrode 74 is a metal layer formed on the surfaces of the resin member 91 and the side surfaces of the module laminate 90. The provision of the shield electrode 74 makes it less likely to cause a leakage of digital noise generated from the wiring units 901, 902, 903, and 904 to external circuits via the main surface 90*a*. It is desirable that the shield electrode 74 be bonded at the side surfaces of the module laminate 90 to the ground electrode formed on the module laminate 90.

In the tracker module 100C according to the third exemplary aspect, at least part of the line 901*a* and at least part of the line 902*a* are disposed between the integrated circuit 80 and the ground electrode 73 in a sectional view of the module laminate 90 and match the ground electrode 73 in a plan view of the module laminate 90.

In the tracker module 100C according to the third exemplary aspect, in a plan view of the module laminate 90, the bump electrode 811 matches part of the ground electrode 73 and the bump electrode 812 also matches part of the ground electrode 73.

In the tracker module 100C according to the third exemplary aspect, in a plan view of the module laminate 90, the individual switches included in the OS switch unit 30A match part of the ground electrode 73.

In the tracker module 100C according to the third exemplary aspect, at least part of the line 903*a* and at least part of the line 904*a* are disposed between the integrated circuit 80 and the ground electrode 73 in a sectional view of the module laminate 90 and match the ground electrode 73 in a plan view of the module laminate 90.

In the tracker module 100C according to the third exemplary aspect, in a plan view of the module laminate 90, the entirety of the integrated circuit 80 matches part of the ground electrode 73.

Since the entirety of the integrated circuit 80 matches part of the ground electrode 73 in a plan view of the module laminate 90, it is highly likely to prevent a leakage of digital noise generated from the wiring units 901, 902, 903, and 904 to the peripheral circuits.

4 Technical Advantages

As described above, tracker modules 100A, 100B, and 100C according to the above-described examples each include a module laminate 90 and an integrated circuit 80 disposed on the module laminate 90. The integrated circuit 80 includes a switch unit included in an output switch circuit 30. Based on a first digital control signal, the output switch circuit 30 selectively outputs at least one of multiple discrete voltages generated based on an input voltage. The first digital control signal includes a digital control line/logic signal indicating one of the multiple discrete voltages. The module laminate 90 includes lines 901*a* and 902*a* and a metal member (one of ground electrodes 71 through 73). The lines 901*a* and 902*a* are connected to the integrated circuit 80. The first digital control signal flows through the lines 901*a* and 902*a*. The metal member is connected to a ground terminal. In a sectional view of the module laminate 90, at least part of the line 901*a* and at least part of the line 902*a* are disposed between the integrated circuit 80 and the metal member. In a plan view of the module laminate 90, the at least part of the line 901*a* and the at least part of the line 902*a* match the metal member.

In an exemplary aspect, when the individual switches of the output switch circuit 30 are mounted on the module laminate 90 as the integrated circuit 80, the following issue arises. The output switch circuit 30 includes wiring units 901 and 902 for transferring DCL signals. In this case, digital noise generated from the wiring units 901 and 902 may become a noise source for peripheral circuits. Although the DCL signal is a control signal based on the envelope, the operating frequency of the DCL signal is not fixed because it is varied in accordance with the channel bandwidth. For this reason, compared with other control lines, configurations for reducing a leakage of digital noise in a wide band are required for the wiring units 901 and 902.

To address this issue, with the above-described configuration, since at least part of the line 901*a* and at least part of the line 902*a* are disposed between the integrated circuit 80 and the ground electrode 71-73, it is less likely to cause a leakage of digital noise generated from the wiring units 901 and 902 to the peripheral circuits. Thus, the tracker modules 100A, 100B, and 100C can be implemented to reduce the occurrence of noise.

Additionally, for example, in the tracker modules 100A, 100B, and 100C according to the above-described exemplary aspects, the output switch circuit 30 may control an output voltage, based on the first digital control signal which corresponds to the envelope signal of a radio-frequency signal.

With this configuration, the digital ET mode can be applied to the power amplifier circuit 2, thereby making it possible to reduce the occurrence of noise.

Moreover, the tracker modules 100A, 100B, and 100C according to the above-described examples each include a module laminate 90 and first and second circuits. The first circuit includes a capacitor C12 including first and second electrodes, a capacitor C15 including third and fourth electrodes, and switches S21, S32, S22, S31, S23, S34, S24, and S33. One end of the switch S21 and one end of the switch S22 are connected to the first electrode. One end of the switch S32 and one end of the switch S31 are connected to the second electrode. One end of the switch S23 and one end of the switch S24 are connected to the third electrode. One end of the switch S34 and one end of the switch S33 are connected to the fourth electrode. The other end of the switch S21, the other end of the switch S32, the other end of the switch S23, and the other end of the switch S34 are connected to each other. The other end of the switch S22 is connected to the other end of the switch S24. The other end of the switch S31 is connected to the other end of the switch S33. The second circuit includes an output terminal 130 and switches S53 and S52. The switch S53 is connected between the output terminal 130 and each of the other end of the switch S21, the other end of the switch S32, the other end of the switch S23, and the other end of the switch S34. The switch S52 is connected between the output terminal 130 and each of the other end of the switch S22 and the other end of the switch S24. The switches S53 and S52 are included in an integrated circuit 80. The module laminate 90 includes lines 901*a* and 902*a* and a metal member (one of ground electrodes 71 through 73). The lines 901*a* and 902*a* are connected to the integrated circuit 80. A first digital control signal including a digital control line/logic signal flows through the lines 901*a* and 902*a*. The metal member is connected to a ground terminal. In a sectional view of the module laminate 90, at least part of the line 901*a* and at least part of the line 902*a* are disposed between the integrated circuit 80 and the metal member. In a plan view of the module laminate 90, the at least part of the line 901*a* and the at least part of the line 902*a* match the metal member.

With the above-described configuration, since at least part of the line 901*a* and at least part of the line 902*a* are disposed between the integrated circuit 80 and the ground electrode 71-73, it is less likely to cause a leakage of digital noise generated from the wiring units 901 and 902 to peripheral circuits. Thus, the tracker modules 100A, 100B, and 100C can be implemented to reduce the occurrence of noise.

Additionally, for example, in the tracker modules 100A, 100B, and 100C, the integrated circuit 80 may also include bump electrodes 811 and 812. The bump electrode 811 is connected to the wiring unit 901. The bump electrode 812 is connected to the wiring unit 902. In a plan view of the module laminate 90, the bump electrode 811 may match at least part of the metal member, and the bump electrode 812 may match at least part of the metal member.

With this configuration, the bump electrodes 811 and 812 for transferring the first digital control signal (DCL signal) therethrough match at least part of the metal member in a plan view of the module laminate 90. It is thus less likely to cause a leakage of digital noise generated from the bump electrodes 811 and 812 to the peripheral circuits.

Additionally, for example, in the tracker modules 100A, 100B, and 100C, in a plan view of the module laminate 90, at least part of the switch unit included in the output switch circuit 30 may match the metal member.

With this configuration, since each of the switches for receiving the first digital control signal (DCL signal) matches the ground electrode 71 in a plan view of the module laminate 90, it is less likely to cause a leakage of digital noise generated from a node between each of the switches and the corresponding one of the wiring units 901 and 902 to the peripheral circuits.

Additionally, for example, in the tracker modules 100A, 100B, and 100C, in a plan view of the module laminate 90, the switches S52 and S53 may match at least part of the metal member.

Additionally, for example, in the tracker module 100C, in a plan view of the module laminate 90, the entirety of the integrated circuit 80 may match at least part of the ground electrode 73.

With this configuration, since the entirety of the integrated circuit 80 matches at least part of the ground electrode 73 in a plan view of the module laminate 90, it is highly likely to prevent a leakage of digital noise generated from the wiring units 901, 902, 903, and 904 to the peripheral circuits.

Additionally, for example, in the tracker module 100A, the module laminate 90 may also include a land electrode 150 to which one of the first digital control signal, a signal indicating a voltage level of the input voltage, and a signal indicating a voltage level of one of the multiple discrete voltages is applied. In a sectional view of the module laminate 90, the ground electrode 71 may be disposed between the integrated circuit 80 and the land electrode 150. In a plan view of the module laminate 90, the land electrode 150 may match at least part of the ground electrode 71.

With this configuration, in a plan view of the module laminate 90, a land electrode 150, which is an I/O terminal with an external circuit, matches part of the ground electrode 71. It is thus less likely to cause a leakage of digital noise from the wiring units 901 and 902 to the external circuits.

Additionally, for example, in the tracker modules 100B and 100C, the module laminate 90 has main surfaces 90*a* and 90*b* facing each other. The integrated circuit 80 may be disposed on the main surface 90*a*, while the metal member may be disposed on the main surface 90*b*.

With this configuration, since the metal member is exposed on the back surface of each of the tracker modules 100B and 100C, the heat dissipation of the tracker modules 100B and 100C is improved.

Additionally, for example, each of the tracker modules 100A, 100B, and 100C may further include a switch unit included in a switched-capacitor circuit 20 or a switch unit included in a pre-regulator circuit 10. The switched-capacitor circuit 20 generates multiple discrete voltages based on an input voltage. The pre-regulator circuit 10 converts the input voltage into a first voltage and outputs the first voltage to the switched-capacitor circuit 20. The module laminate 90 may also include a line 903*a* or 904*a*. A second digital control signal that controls the switch unit included in the switched-capacitor circuit 20 or the switch unit included in the pre-regulator circuit 10 flows through the line 903*a* or 904*a*. In a sectional view of the module laminate 90, at least part of the line 903*a* or 904*a* may be disposed between the integrated circuit 80 and the metal member. In a plan view of the module laminate 90, at least part of the line 903*a* or 904*a* may match the metal member.

With this configuration, since at least part of the line 903*a* and at least part of the line 904*a* are disposed between the integrated circuit 80 and the metal member, it is less likely to cause a leakage of digital noise generated from the lines 903*a* and 904*a* for transferring control signals, which are not DCL signals, to the peripheral circuits. Thus, the tracker modules 100A, 100B, and 100C can be implemented to reduce the occurrence of noise.

A communication device 7 according to the embodiment includes an RFIC 5, a power amplifier circuit 2, and the tracker module 100A, 100B, or 100C. The RFIC 5 processes a radio-frequency signal. The power amplifier circuit 2 transfers the radio-frequency signal between the RFIC 5 and an antenna 6. The tracker module 100A, 100B, or 100C supplies a power supply voltage $V_{ET}$ to the power amplifier circuit 2.

With this configuration, the communication device 7 achieve advantages similar to the above-described technical advantages of the tracker module 100A, 100B, or 100C.

(Additional Exemplary Embodiments)

It is noted that the tracker modules and the communication device according to the present disclosure have been discussed above through illustration of the embodiment and examples. However, the tracker modules and the communication device according to the exemplary aspects are not restricted to the above-described embodiment and examples. Other embodiments implemented by combining certain elements in the above-described embodiment and examples and modified examples obtained by making various modifications to the above-described embodiment and examples by those skilled in the art without departing from the scope and spirit of the invention. Various types of equipment integrating the above-described tracker modules and communication device are also encompassed in the invention.

In one exemplary aspects, in the circuit configurations of the tracker module and the communication device according to the above-described embodiment, another circuit element and another line may be inserted onto a path connecting circuit elements and a signal path illustrated in the drawings.

REFERENCE SIGNS LIST

1 power supply circuit
2 power amplifier circuit
3 filter
4 PA control circuit
5 RFIC
6 antenna
7 communication device
10 pre-regulator circuit
10A PR switch unit
20 switched-capacitor circuit
20A SC switch unit
30 output switch circuit
30A OS switch unit
40 filter circuit
50 DC power source
71, 72, 73 ground electrode
74 shield electrode
80 integrated circuit
81, 811, 812, 813, 814 bump electrode
90 module laminate
90*a*, 90*b* main surface
91 resin member
100A, 100B, 100C tracker module
110, 131, 132, 133, 134, 140 input terminal
111, 112, 113, 114, 130, 141 output terminal
115, 116 inductor connection terminal
117, 120, 135, 136 control terminal
150 land electrode
901, 902, 903, 904 wiring unit
901*a*, 902*a*, 903*a*, 904*a* line
901*b*, 901*c*, 902*b*, 902*c*, 903*b*, 903*c*, 904*b*, 904*c* via-conductor
C10, C11, C12, C13, C14, C15, C16, C20, C30, C40, C51, C52, C61, C62, C63, C64 capacitor
L51, L52, L53 inductor
L71 power inductor
R51 resistor
S11, S12, S13, S14, S21, S22, S23, S24, S31, S32, S33, S34, S41, S42, S43, S44, S51, S52, S53, S54, S61, S62, S63, S71, S72 switch

What is claimed:

1. A tracker module comprising:
a module laminate; and
an integrated circuit disposed on the module laminate and including a switch unit included in an output switch circuit that is configured to selectively output, based on a first digital control signal, at least one of a plurality of discrete voltages generated based on an input voltage, the first digital control signal includes a digital control line/logic signal indicating one of the plurality of discrete voltages,
wherein the module laminate includes:
a first control line connected to the integrated circuit, the first digital control signal flowing through the first control line, and
a metal member connected to a ground terminal,
wherein, in a sectional view of the module laminate, at least a portion of the first control line is disposed between the integrated circuit and the metal member, and
wherein, in a plan view of the module laminate, at least a portion of the first control line matches the metal member.

2. The tracker module according to claim 1, wherein the output switch circuit is configured to control an output voltage based on the first digital control signal.

3. The tracker module according to claim 2, wherein the first digital control signal corresponds to an envelope signal of a radio-frequency signal.

4. The tracker module according to claim 1, wherein:
the digital control line/logic signal includes a plurality of digital control line/logic signals, and
the first control line includes a first line and a second line, with a first signal of the plurality of digital control line/logic signals flowing through the first line, and a second signal of the plurality of digital control line/logic signals flowing through the second line.

5. The tracker module according to claim 1, wherein the integrated circuit further comprises:
a first IC terminal connected to the first line, and
a second IC terminal connected to the second line,
wherein, in the plan view of the module laminate, the first IC terminal matches at least part of the metal member, and the second IC terminal matches at least part of the metal member.

6. The tracker module according to claim 1, wherein, in the plan view of the module laminate, at least part of the switch unit included in the output switch circuit matches the metal member.

7. The tracker module according to claim 1, wherein, in the plan view of the module laminate, an entirety of the integrated circuit matches at least part of the metal member.

8. The tracker module according to claim 1, wherein the module laminate further includes an external connection terminal to which one of the first digital control signal, a signal indicating a voltage level of the input voltage, and a signal indicating a voltage level of one of the plurality of discrete voltages is applied.

9. The tracker module according to claim 8, wherein:
in the sectional view of the module laminate, the metal member is disposed between the integrated circuit and the external connection terminal; and
in the plan view of the module laminate, the external connection terminal matches at least part of the metal member.

10. The tracker module according to claim 1, wherein:
the module laminate has first and second main surfaces that oppose each other;
the integrated circuit is disposed on the first main surface; and
the metal member is disposed on the second main surface.

11. The tracker module according to claim 1, wherein the integrated circuit further comprises:
a switch unit included in a switched-capacitor circuit that is configured to generate the plurality of discrete voltages based on an input voltage,
wherein the module laminate further includes a second control line having a second digital control signal flowing therethrough that is configured to control the switch unit included in the switched-capacitor circuit,
wherein, in the sectional view of the module laminate, at least a portion of the second control line is disposed between the integrated circuit and the metal member, and
wherein, in the plan view of the module laminate, at least a portion of the second control line matches the metal member.

12. The tracker module according to claim 1, wherein the integrated circuit further comprises:

a switch unit included in a pre-regulator circuit that is configured to convert the input voltage into a first voltage and to output the first voltage to a switched-capacitor circuit, wherein the module laminate also includes a second control line having a second digital control signal flowing therethrough that is configured to control the switch unit included in the pre-regulator circuit, wherein, in the sectional view of the module laminate, at least a portion of the second control line is disposed between the integrated circuit and the metal member, and wherein, in the plan view of the module laminate, at least a portion of the second control line matches the metal member.

13. A communication device comprising:

a signal processing circuit configured to process a radio-frequency signal;

a power amplifier circuit configured to transfer the radio-frequency signal between the signal processing circuit and an antenna; and the tracker module according to claim 1 that is configured to supply a power supply voltage to the power amplifier circuit.

14. A tracker module comprising:

a module laminate;

a first circuit that includes:

a first capacitor including first and second electrodes, a second capacitor including third and fourth electrodes, and first, second, third, fourth, fifth, sixth, seventh, and eighth switches, wherein:

a first end of the first switch and a first end of the third switch are connected to the first electrode, a first end of the second switch and a first end of the fourth switch are connected to the second electrode, a first end of the fifth switch and a first end of the seventh switch are connected to the third electrode, a first end of the sixth switch and a first end of the eighth switch are connected to the fourth electrode, a second end of the first switch, a second end of the second switch, a second end of the fifth switch, and a second end of the sixth switch are connected to each other, a second end of the third switch is connected to a second end of the seventh switch, and a second end of the fourth switch is connected to a second end of the eighth switch; and a second circuit that includes:

a first output terminal, a ninth switch connected between the first output terminal and each of the second ends of the first switch, the second switch, the fifth switch, and the sixth switch, and a tenth switch connected between the first output terminal and each of the second ends of the third switch and the seventh switch, wherein the ninth and tenth switches are included in an integrated circuit, wherein the module laminate includes:

a first control line connected to the integrated circuit and having a first digital control signal flowing through the first control line that includes a digital control line/logic signal, and a metal member connected to a ground terminal, wherein, in a sectional view of the module laminate, at least a portion of the first control line is disposed between the integrated circuit and the metal member, and wherein, in a plan view of the module laminate, at least a portion of the first control line matches the metal member.

15. The tracker module according to claim 14, wherein, in the plan view of the module laminate, the ninth and tenth switches match at least part of the metal member.

16. The tracker module according to claim 14, wherein:

the digital control line/logic signal includes a plurality of digital control line/logic signals, and the first control line includes a first line and a second line, with a first signal of the plurality of digital control line/logic signals flowing through the first line, and a second signal of the plurality of digital control line/logic signals flowing through the second line.

17. The tracker module according to claim 16, wherein the integrated circuit further comprises:

a first IC terminal connected to the first line, and a second IC terminal connected to the second line, wherein, in the plan view of the module laminate, the first IC terminal matches at least part of the metal member, and the second IC terminal matches at least part of the metal member.

18. The tracker module according to claim 15, wherein:

the module laminate has first and second main surfaces that oppose each other;

the integrated circuit is disposed on the first main surface; and the metal member is disposed on the second main surface.

19. The tracker module according to claim 15, wherein the integrated circuit further comprises:

a switch unit included in a switched-capacitor circuit that is configured to generate the plurality of discrete voltages based on an input voltage, wherein the module laminate further includes a second control line having a second digital control signal flowing therethrough that is configured to control the switch unit included in the switched-capacitor circuit, wherein, in the sectional view of the module laminate, at least a portion of the second control line is disposed between the integrated circuit and the metal member, and wherein, in the plan view of the module laminate, at least a portion of the second control line matches the metal member.

20. The tracker module according to claim 15, wherein the integrated circuit further comprises:

a switch unit included in a pre-regulator circuit that is configured to convert the input voltage into a first voltage and to output the first voltage to a switched-capacitor circuit, wherein the module laminate also includes a second control line having a second digital control signal flowing therethrough that is configured to control the switch unit included in the pre-regulator circuit, wherein, in the sectional view of the module laminate, at least a portion of the second control line is disposed between the integrated circuit and the metal member, and wherein, in the plan view of the module laminate, at least a portion of the second control line matches the metal member.

* * * * *